(12) United States Patent
Okura et al.

(10) Patent No.: US 9,590,652 B2
(45) Date of Patent: *Mar. 7, 2017

(54) SOLID-STATE IMAGING APPARATUS AND SEMICONDUCTOR DEVICE

(71) Applicant: RENESAS ELECTRONICS CORPORATION, Kanagawa (JP)

(72) Inventors: Shunsuke Okura, Kanagawa (JP); Fukashi Morishita, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 12 days.

This patent is subject to a terminal disclaimer.

(21) Appl. No.: 14/702,492

(22) Filed: May 1, 2015

(65) Prior Publication Data
US 2015/0236712 A1    Aug. 20, 2015

Related U.S. Application Data

(63) Continuation of application No. 14/301,120, filed on Jun. 10, 2014, now Pat. No. 9,041,580.

(30) Foreign Application Priority Data

Jun. 11, 2013  (JP) .................................. 2013-122933

(51) Int. Cl.
H03M 1/46       (2006.01)
H04N 5/378     (2011.01)

(52) U.S. Cl.
CPC ............ *H03M 1/468* (2013.01); *H04N 5/378* (2013.01)

(58) Field of Classification Search
CPC ........ H03M 1/46; H03M 1/462; H03M 1/464; H03M 1/466; H03M 1/468
See application file for complete search history.

(56) References Cited

U.S. PATENT DOCUMENTS

| 5,218,362 A | 6/1993 | Mayes et al. |
| 5,287,108 A | 2/1994 | Mayes et al. |
| 8,816,892 B2 | 8/2014 | Huang et al. |

(Continued)

OTHER PUBLICATIONS

Notice of Allowance U.S. Appl. No. 14/301,120 dated Jan. 22, 2015.

(Continued)

*Primary Examiner* — Tony Ko
(74) *Attorney, Agent, or Firm* — McDermott Will & Emery LLP

(57) ABSTRACT

The present invention provides a small-sized inexpensive solid-state imaging apparatus. A D/A converter included in a successive comparison type A/D converter of the solid-state imaging apparatus includes a multiplexer which selects any of reference voltages VR0 to VR16 and sets it as an analog reference signal when coarse A/D conversion is performed, and which selects reference voltages VR (n−1) to VR (n+2) of the reference voltages VR0 to VR16 when fine A/D conversion is performed, and a capacitor array which generates an analog reference signal, based on the reference voltages VR (n−1) to VR (n+2) when the fine A/D conversion is performed. It is thus possible to reduce settling errors in reference voltage without using redundant capacitors.

13 Claims, 20 Drawing Sheets

(56) References Cited

U.S. PATENT DOCUMENTS 9,041,580 B2* 5/2015 Okura ................ H04N 5/37455
341/156

OTHER PUBLICATIONS

Steven Huang et al., "Design of a PCT-Inspired Segmented ADC for High-Speed Column-Parallel CMOS Image Sensor", Forza Silicon Corporation, International Image Sensor Workshop, 2011, 4 pgs.
Chun-Cheng Liu et al., "A 10b 100MS/s 1.13 mW SAR ADC with Binary-Scaled Error Compensation" National Cheng-Kung University, IEEE International Solid-State Circuits Conference, 2010, pp. 386-388.

* cited by examiner

FIG. 9

| NORMAL COMPARISON RESULT OF kTH BIT | REDUNDANT COMPARISON RESULT OF kTH BIT (k') | OUTPUT CODE |
|---|---|---|
| 0 | 0 | $-2^{k-1}$ |
| 0 | 1 | 0 |
| 1 | 0 | $2^{k-1}$ |
| 1 | 1 | $2^k$ |

FIG. 10

| NORMAL COMPARISON RESULT OF kTH BIT | REDUNDANT COMPARISON RESULT OF kTH BIT (k') | OUTPUT CODE | |
|---|---|---|---|
| | | AT THE UPPERMOST SUBRANGE | AT THE LOWERMOST SUBRANGE |
| 0 | 0 | $-2^{k-1}$ | 0 |
| 0 | 1 | 0 | 0 |
| 1 | 0 | $2^{k-1}$ | $2^{k-1}$ |
| 1 | 1 | $2^{k-1}$ | $2^k$ |

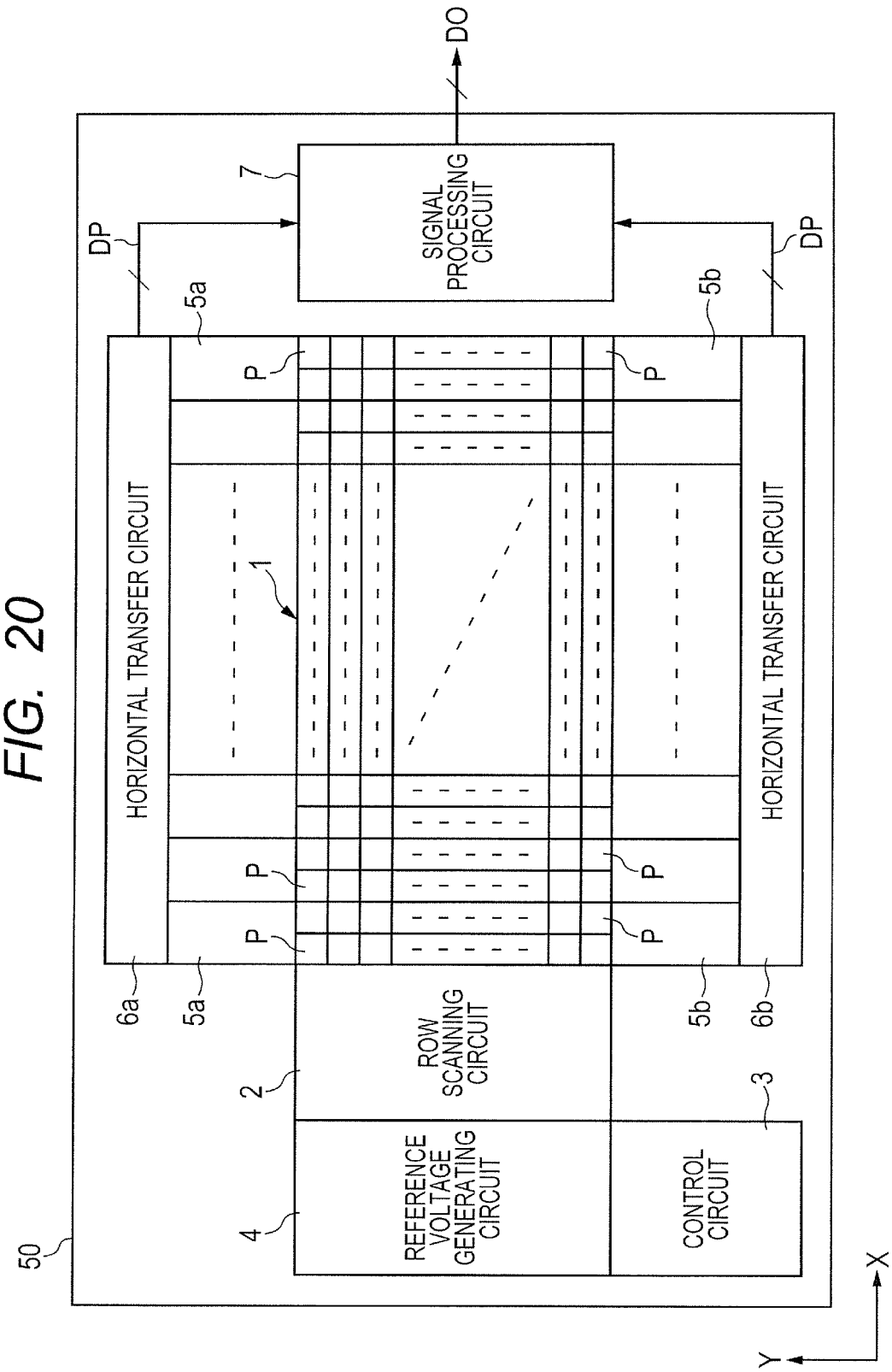

SOLID-STATE IMAGING APPARATUS AND SEMICONDUCTOR DEVICE

CROSS-REFERENCE TO RELATED APPLICATIONS

This application is a Continuation Application of U.S. Ser. No. 14/301,120 filed Jun. 10, 2014, which claims priority from Japanese Patent Application No. 2013-122933 filed on Jun. 11, 2013 the subject matter of each is incorporated herein by reference in entirety.

BACKGROUND

The present invention relates to a solid-state imaging apparatus and a semiconductor device, and is suitably usable in, for example, a solid-state imaging apparatus and a semiconductor device both equipped with successive comparison type A/D converters.

A digital camera captures a subject and forms an image on a solid-state imaging apparatus as an optical image. The solid-state imaging apparatus is roughly divided into CCD (Charge Coupled Device) and CMOS (Complementary Metal Oxide Semiconductor) image sensors. From the viewpoint of attaining high performance of the camera, a CMOS image sensor easy to be equipped with a CMOS circuit for image processing as a peripheral circuit is increasingly attracting attention. As the CMOS image sensor, there are known an analog image sensor and a digital image sensor. Although each of them has its merits and demerits, there are high expectations for the digital image sensor in terms of a data processing speed.

In the digital image sensor, an A/D (Analog-to-Digital) converter is provided in each column of a pixel array. There has been disclosed in, for example, a Non-Patent Document 1, a digital image sensor using successive comparison type A/D converters. In this type of digital image sensor, a pixel array including a plurality of pixels disposed in a plurality of rows and a plurality of columns is provided, and an analog pixel signal is outputted to a column signal line corresponding to each column.

The successive comparison type A/D converters are provided in each column and respectively equipped with an S/H (Sample-and-Hold) circuit, a D/A (Digital-to-Analog) converter, a comparator, and a successive approximation register. The voltage of the analog pixel signal and the output voltage of the D/A converter are compared with each other. The successive approximation register performs binary search control according to its comparison result in such a manner that the output voltage of the D/A converter approximates the analog pixel signal. A control code of the successive approximation register when the output signal of the D/A converter approximates the analog pixel signal is outputted as a digital pixel signal.

By executing A/D conversions of two steps using a plurality of subrange regions, the area of the D/A converter has been reduced and further differential nonlinearity (DNL) has been improved. In the two-step A/D conversions, a coarse A/D conversion is performed on the subrange regions by the binary search. The remaining fine A/D conversion is performed on the selected subrange region by a general successive comparison using a binary-weighted capacitor array, using a reference voltage for giving the region. Further, since the settling time of the reference voltage becomes a problem in a solid-state imaging apparatus provided with a plurality of A/D converters in parallel, the stabilization of the reference voltage is achieved by coupling to each external decouple capacitor.

Further, there has been disclosed in a Non-Patent Document 2, a circuit which corrects a settling error of a reference voltage of a successive comparison type A/D converter. A D/A converter which generates a comparison voltage is provided with a redundant capacitor to execute a redundant successive comparison operation, thereby enabling correction of the settling error by digital signal processing.

RELATED ART DOCUMENTS

[Non-Patent Document 1] "Design of a PTC-Inspired Segmented ADC for High Speed Column Parallel CMOS Image Sensor", Forza Silicon (USA), INTERNATIONAL IMAGE SENSOR WORKSHOP, 2011

[Non-Patent Document 2] "A 10b 100 MS/s 1.13 mW SAR ADC with Binary-Scaled Error Compensation", National Cheng-Kung University (Taiwan), IEEE International Solid-State Circuits Conference, 2010

SUMMARY

In the Non-Patent Document 1, however, a problem arises in that since the external decouple capacitors are used in plural column cycles to solve the problem about the settling error of the reference voltage, many decouple capacitors are required, the size of the apparatus becomes larger and the cost thereof is increased.

Also in the Non-Patent Document 2, the external decouple capacitors become unnecessary because the redundant comparison operation is performed. A problem, however, arises in that since the redundant capacitor is used, a chip area increases and a chip cost becomes high.

Other objects and novel features of the present invention will become apparent from the description of the present specification and the accompanying drawings.

According to one embodiment, it includes a multiplexer which when a coarse A/D conversion is performed, selects any of first through Nth reference voltages and sets it as an analog reference signal and when a fine A/D conversion is performed, selects (n−1)th through (n+2)th reference voltages of a plurality reference voltages, and a capacitor array which generates an analog reference signal, based on the (n−1)th through (n+2)th reference voltages when the fine A/D conversion is performed.

According to one embodiment, it is possible to reduce a settling error of a reference voltage without using external decouple capacitors and redundant capacitors provided every plural columns. It is thus possible to achieve miniaturization of an apparatus and a reduction in its cost.

BRIEF DESCRIPTION OF THE DRAWINGS

FIG. 9 is a diagram illustrating a relationship between two comparison results of a kth bit of the successive comparison type A/D converter shown in FIG. 3 and an output code thereof;

FIG. 10 is another diagram showing a relationship between two comparison results of a kth bit of the successive comparison type A/D converter shown in FIG. 3 and an output code thereof;

FIG. 20 is a block diagram showing the layout of a solid-state imaging apparatus according to an eighth embodiment of the present application.

DETAILED DESCRIPTION

First Embodiment

Figure 1:
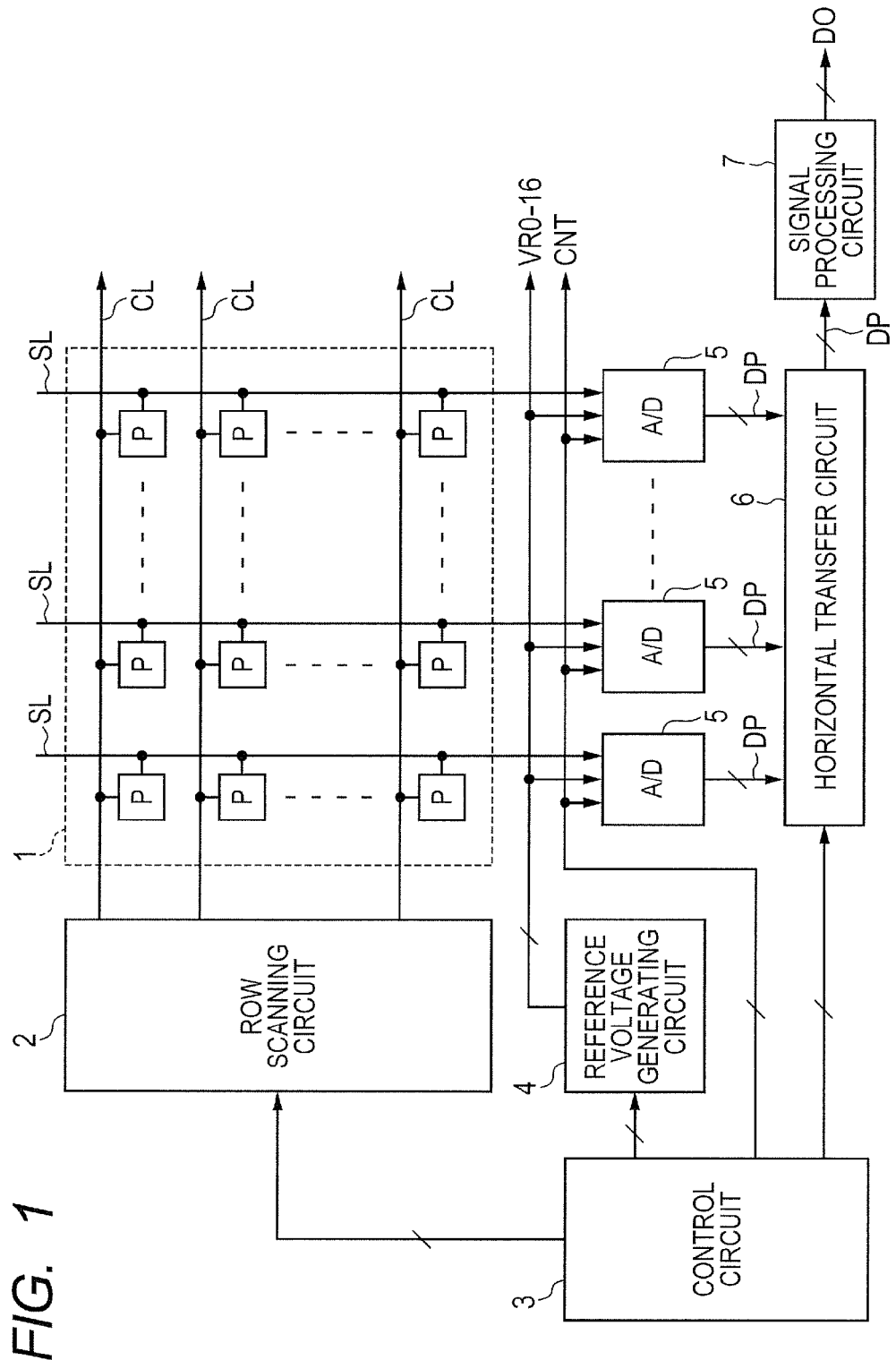
FIG. 1 is a block diagram showing a configuration of a solid-state imaging apparatus according to a first embodiment of the present application.

A solid-state imaging apparatus according to a first embodiment of the present application is a semiconductor device formed over a semiconductor substrate. As shown in FIG. 1, the solid-state imaging apparatus is equipped with a pixel array 1, a row scanning circuit 2, and a control circuit 3. The pixel array 1 includes a plurality of pixel circuits P arranged in a plurality of rows and columns, a plurality of control lines CL provided corresponding to the plural rows respectively, and a plurality of signal lines SL provided corresponding to the plural columns respectively. Each of the pixel circuits P outputs an analog pixel signal VA having a voltage corresponding to an incident light quantity. The pixel circuit P is coupled to the control line CL of the corresponding row and the signal line SL of the corresponding column. The control lines CL are respectively coupled to the row scanning circuit 2.

The row scanning circuit 2 is controlled by the control circuit 3, and sequentially selects the plural rows on a row-by-row basis and brings the control line CL of the selected row to an activation level. Each pixel circuit P is activated in response to the corresponding control line CL being brought to the activation level and outputs an analog pixel signal VA of voltage corresponding to an incident light quantity to the corresponding signal line SL. The control circuit 3 controls the entire solid-state imaging apparatus.

Further, the solid-state imaging apparatus is equipped with a reference voltage generating circuit 4, a plurality of successive comparison type A/D converters 5, a horizontal transfer circuit 6, and a signal processing circuit 7. The reference voltage generating circuit 4 generates seventeen reference voltages VR0 through VR16. The reference voltages VR0 through VR16 are sequentially increased by a prescribed voltage. The reference voltages VR0 through VR16 are given to the successive comparison type A/D converters 5 respectively. The successive comparison type A/D converters 5 are respectively coupled to the signal lines SL.

Each of the successive comparison type A/D converters 5 is operated in accordance with a control signal CNT from the control circuit 3 to convert the analog pixel signal VA outputted from the pixel circuit P activated by the row scanning circuit 2 to the corresponding signal line SL to a digital pixel signal DP of 17 bits. The successive comparison type A/D converter 5 performs plural times (four times, for example) a coarse A/D conversion (A/D conversion of high order bits) including a normal comparison operation, based on the reference voltages VR0 through VR16 and thereafter performs a fine A/D conversion (A/D conversion of low order bits) including a plurality of times (e.g., ten times) of normal comparison operations and a plurality of times (e.g., three times) of redundant comparison operations.

A data signal of one bit is generated during one normal comparison operation. A data signal of one bit is generated during one redundant comparison operation. Thus, data signals of 17 bits in total are generated, and the analog pixel signal VA is converted to the digital pixel signal DP including the data signals of 17 bits.

The horizontal transfer circuit 6 temporarily holds therein a plurality of digital pixel signals DP corresponding to one row given from the successive comparison type A/D converters 5 and thereafter sequentially transfers the held digital pixel signals DP to the signal processing circuit 7 one by one. The signal processing circuit 7 generates a digital pixel signal DO of 14 bits, based on the 17-bit digital pixel signal DP and outputs the generated digital pixel signal DO to the outside.

Figure 2:
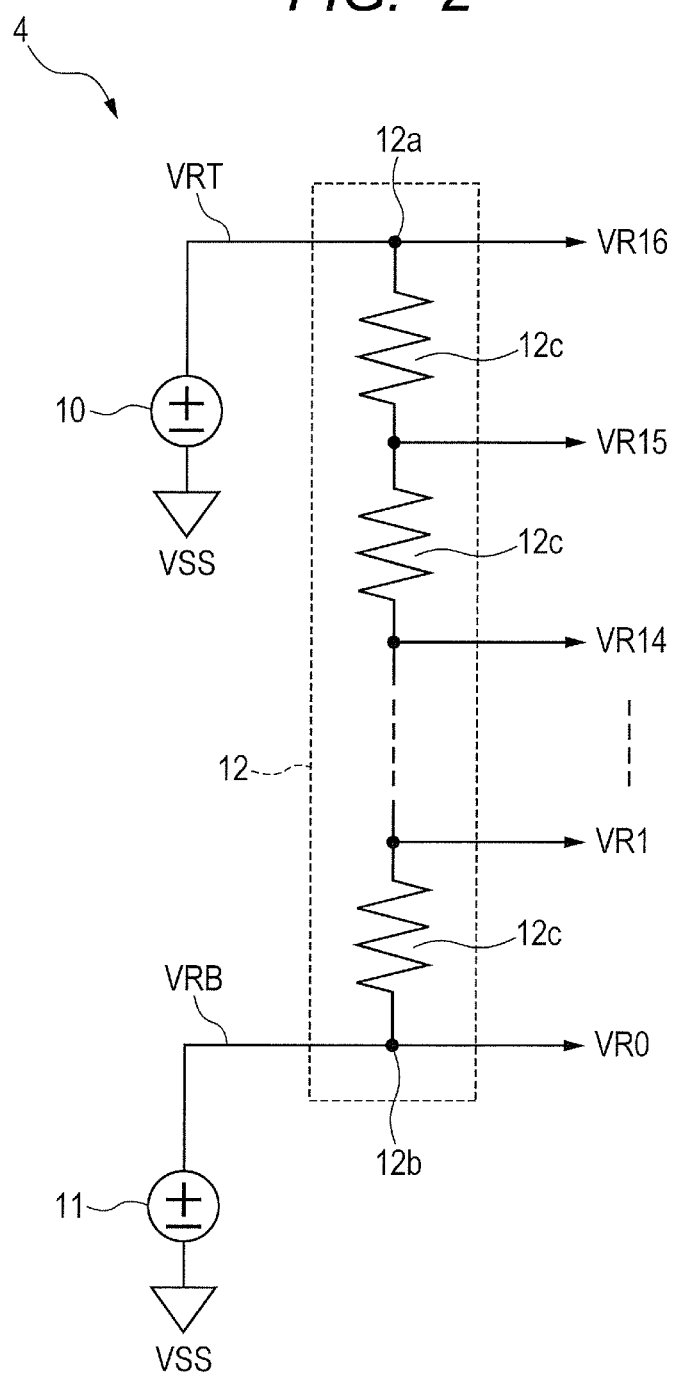
FIG. 2 is a circuit diagram showing a configuration of a reference voltage generating circuit shown in FIG. 1.

FIG. 2 is a circuit diagram showing the configuration of the reference voltage generating circuit 4. In FIG. 2, the reference voltage generating circuit 4 includes constant voltage sources 10 and 11, and a ladder resistor 12. The positive electrode of the constant voltage source 10 is coupled to one terminal 12a of the ladder resistor 12, and the negative electrode thereof is coupled to a line of a ground voltage VSS. The positive electrode of the constant voltage source 11 is coupled to the other terminal 12b of the ladder resistor 12, and the negative electrode thereof is coupled to the line of the ground voltage VSS. The constant voltage sources 10 and 11 respectively output constant voltages VRT and VRB. They are given as VRT>VRB.

The constant voltages VRT and VRB become reference voltages VR16 and VR0 respectively. The ladder resistor 12 includes sixteen resistive elements 12c coupled in series between the terminals 12a and 12b. The ladder resistor 12 divides the voltage between the reference voltage VR16 and the reference voltage VR0 to generate reference voltages VR15 through VR1. The reference voltages VR15 through VR1 become voltages obtained by equally dividing the voltage between the reference voltages VR16 and VR0.

Figure 3:
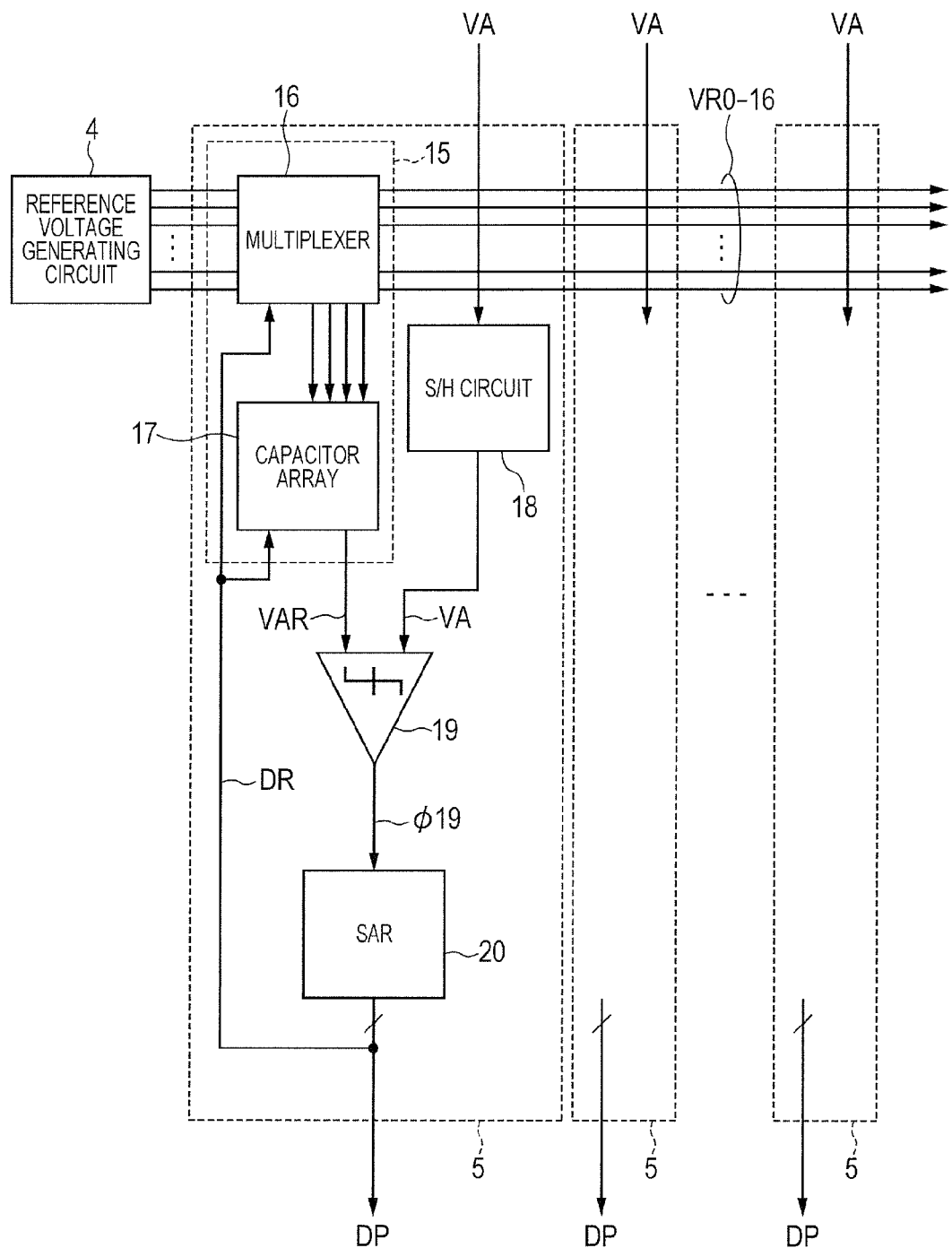
FIG. 3 is a block diagram showing a configuration of a successive comparison type A/D converter shown in FIG. 1.

FIG. 3 is a block diagram showing the configuration of the successive comparison type A/D converter 5. In FIG. 3, the successive comparison type A/D converter 5 includes a D/A converter 15, an S/H circuit 18, a comparator 19, and a successive approximation register (SAR) 20. The D/A converter 15 includes a multiplexer 16 and a capacitor array 17 and is controlled by the control signal from the control circuit 3.

The reference voltages VR0 through VR16 generated by the reference voltage generating circuit 4 are supplied to the multiplexers 16 of all A/D converters 5. When the coarse A/D conversion is performed, the multiplexer 16 selects any of the reference voltages VR0 through VR16 in accordance with a digital reference signal DR from the successive approximation register 20 and supplies the selected reference voltage to the comparator 19 as an analog reference signal VAR.

When the fine A/D conversion is performed, the multiplexer 16 selects four reference voltages VR (n−1) through VR (n+2) of the reference voltages VR0 through VR16 in accordance with the digital reference signal DR and supplies the selected reference voltages to the capacitor array 17.

When the fine A/D conversion is performed, the capacitor array 17 generates an analog reference voltage VAR using the reference voltages VR (n−1) through VR (n+2) in accordance with the digital reference signal DR.

The S/H circuit 18 is controlled by the control signal CNT outputted from the control circuit 3 and holds and outputs the analog pixel signal VA supplied from the corresponding signal line SL in a prescribed cycle. The comparator 19 compares the magnitude of the voltage of the analog pixel signal VA and the magnitude of the voltage of the analog reference signal VAR and outputs a signal $\phi19$ indicative of a result of comparison.

The successive approximation register 20 is controlled by the control signal CNT supplied from the control circuit 3 and is operated based on the output signal $\phi19$ of the comparator 19 to generate a digital reference signal DR in such a manner that the voltage of the analog reference signal VAR is approximate to the voltage of the analog pixel signal VA. The digital reference signal DR when the voltage of the analog reference signal VAR is approximate to that of the analog pixel signal VA reaches a digital pixel signal DP of 17 bits.

Figure 4:
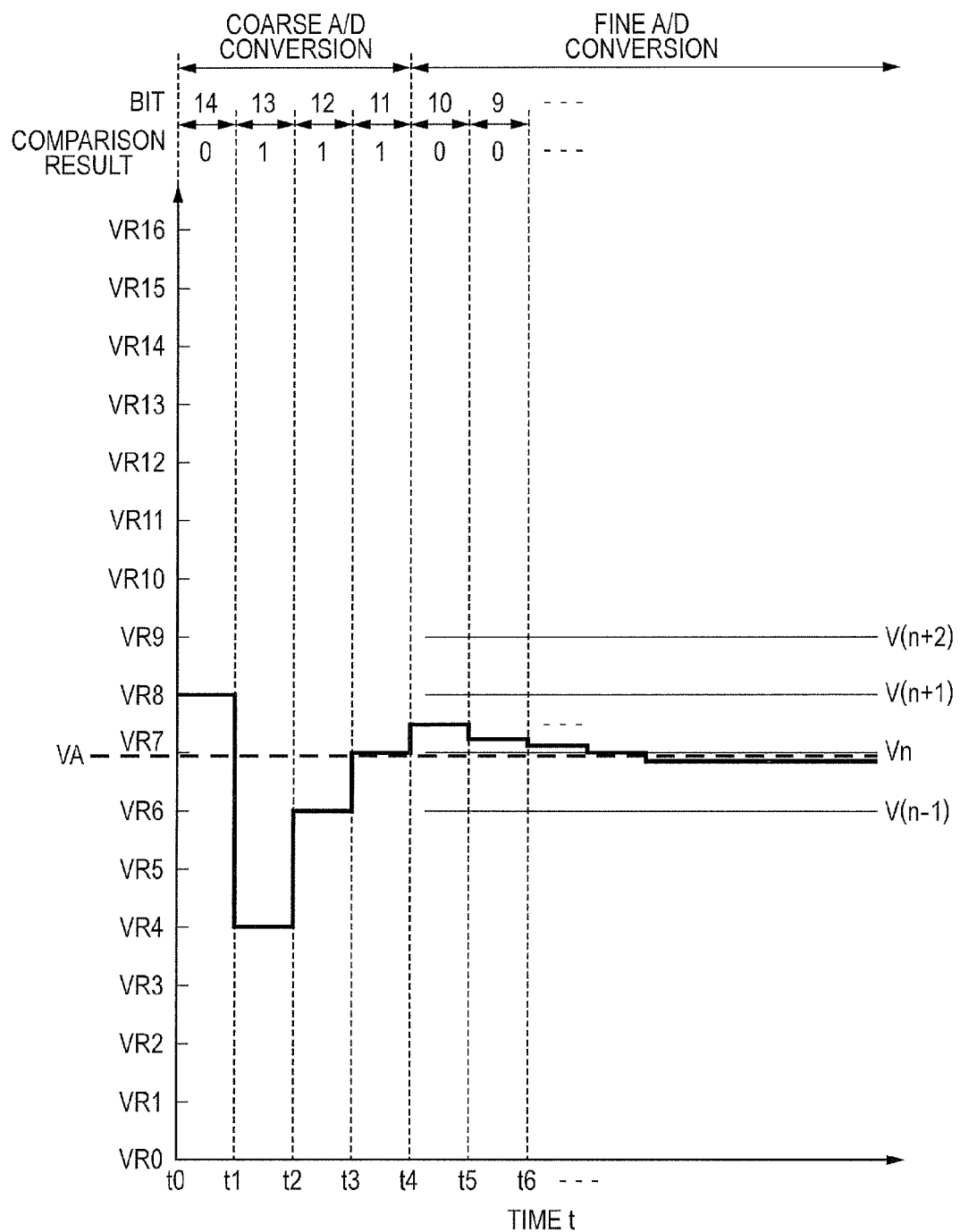
FIG. 4 is a time chart showing the operation of the successive comparison type A/D converter shown in FIG. 3.

FIG. 4 is a time chart illustrating the operation of the successive comparison type A/D converter 5. In FIG. 4, the A/D converter 5 performs a coarse A/D conversion of 4 bits (14 through 11 bits) at the times t0 through t4 and thereafter performs a fine A/D conversion of 10 bits (10 through 1 bits) at the times t4 through t14.

In the coarse A/D conversion, an analog reference signal VAR is generated using the reference voltage VR0 through VR16. The voltage of the generated analog reference signal VAR and the voltage of the analog pixel signal VA are compared with each other, and successive approximation by binary search is performed. In the coarse A/D conversion, any one of 16 subrange regions between the reference voltages VR0 through VR16 is selected as a subrange region including the analog pixel signal VA. The subrange region located immediately above the selected subrange region is selected as a higher subrange region. Further, the subrange region located immediately below the selected subrange region is selected as a lower subrange region.

The voltage of the selected subrange region is taken between Vn and V (n+1), the voltage of the higher subrange region is taken between V (n+1) and V (n+2), and the voltage of the lower subrange region is taken between V (n−1) and Vn. In the fine A/D conversion, an analog reference signal VAR is generated using the reference voltage V (n−1) through V (n+2). The voltage of the generated analog reference signal VAR and the voltage of the analog pixel signal VA are compared with each other, and successive approximation by binary search is performed. Each subrange region is divided into sectional regions of $2^{10}=1024$. In the fine A/D conversion, any one of sectional regions of $3\times2^{10}=3072$ included in the three subrange regions between the reference voltages V (n−1) and V (n+2) is selected as the sectional region including the analog pixel signal VA.

FIG. 4 shows a case where the voltage of the analog pixel signal VA is only slightly lower than the reference voltage VR7. In a 14th-bit decision (time t0 to t1), the intermediate reference voltage VR8 between the reference voltages VR0 and VR16 is used as the analog reference signal VAR, and the magnitude of the reference voltage VR8 and the magnitude of the analog pixel signal VA are compared with each other. Since VR8>VA here, a data signal of a 14th bit becomes "0".

Since the data signal of the 14th bit is "0", in a 13th bit decision (time t1 to t2), the intermediate reference voltage VR4 between the reference voltages VR0 and VR8 is used as the analog reference signal VAR, and the magnitude of the reference voltage VR4 and the magnitude of the analog pixel signal VA are compared with each other. Since VR4<VA here, a data signal of a 13th bit becomes "1".

Since the data signal of the 13th bit is "1", in a 12th-bit decision (time t2 to t3), the intermediate reference voltage VR6 between the reference voltages VR4 and VR8 is used as the analog reference signal VAR, and the magnitude of the reference voltage VR6 and the magnitude of the analog pixel signal VA are compared with each other. Since VR6<VA here, a data signal of a 12th bit becomes "1".

Since the data signal of the 12th bit is "1", in an 11th-bit decision (time t3 to t4), the intermediate reference voltage VR7 between the reference voltages VR6 and VR8 is used as the analog reference signal VAR, and the magnitude of the reference voltage VR7 and the magnitude of the analog pixel signal VA are compared with each other. There is shown a case where a data signal of an 11th bit should be "0" because VR7>VA originally, but VR7<VA due to the error of the reference voltage VR7, and hence a data signal of an 11th bit becomes "1".

Incidentally, since the reference voltages VR0 through VR16 generated by the reference voltage generating circuit 4 are supplied to many A/D converters 5 through seventeen wires as shown in FIG. 1, errors are easy to occur in the reference voltages VR0 through VR16 in the A/D converters 5 far away from the reference voltage generating circuit 4. Erroneous determination made due to the errors of the reference voltages VR0 through VR16 is corrected based on the result of a redundant comparison in the fine A/D conversion. This will be described in detail later.

Since the data signal of the 11th bit is "i", the region for VR7 to VR8 is selected as the subrange region in which the analog pixel signal VA exists, the region for VR8 to VR9 is selected as the higher subrange region, and the region for VR6 to VR7 is selected as the lower subrange region. The capacitor array 17 generates an analog reference signal VAR using the selected reference voltages VR6 through VR9.

After a 10th bit, the analog reference signal VAR generated by the capacitor array 17 and the analog pixel signal VA are compared with each other, followed by execution of the fine A/D conversion.

Figure 5:
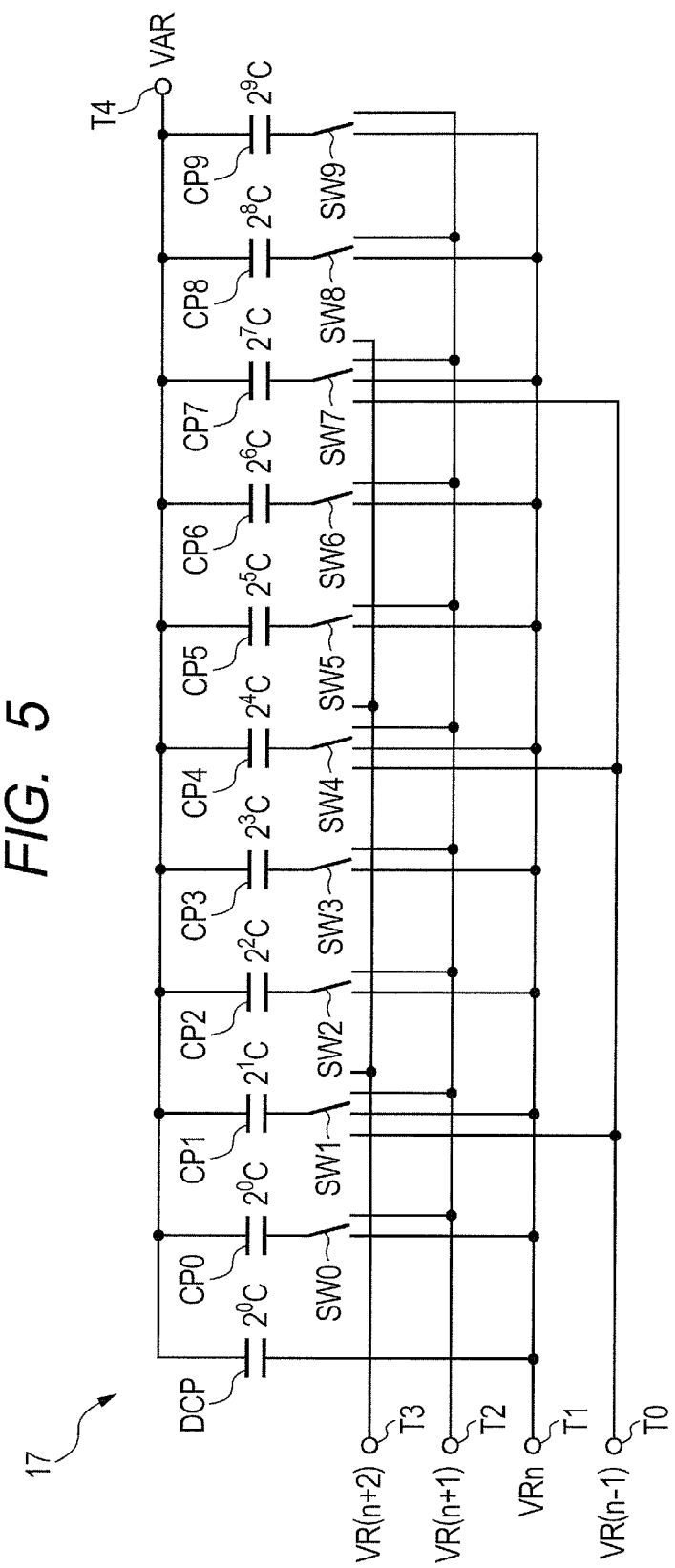
FIG. 5 is a circuit diagram illustrating a configuration of a capacitor array shown in FIG. 3.

FIG. 5 is a circuit diagram showing the configuration of the capacitor array 17. In FIG. 5, the capacitor array 17 includes input terminals T0 through T3, an output terminal T4, a dummy capacitor DCP, capacitors CP0 through CP9, and switches SW0 through SW9. The switches SW0 through SW9 respectively configure first through Mth switching circuits.

The input terminals T0 through T3 respectively receive the reference voltages VR (n−1) through VR (n+2). The analog reference signal VAR appears in the output terminal T4. The dummy capacitor DCP is coupled between the terminals T1 and T4. One electrodes of the capacitors CP0 through CP9 are coupled to the output terminal T4. If the capacitance value of the capacitor CP0 is taken to be $2^0C$, the capacitance values of the capacitors CP1 through CP9 are respectively set to $2^1C$ through $2^9C$, and the capacitance value of the dummy capacitor DCP is set to $2^0C$ The sum of the capacitance values of the capacitors DCP and CP0 through CP9 becomes $2^{10}C$.

The switches SW0, SW2, SW3, SW5, SW6, SW8 and SW9 respectively couple the other electrodes of the capacitors CP0, CP2, CP3, CP5, CP6, CP8 and CP9 to the input terminal T1 or T2 during normal comparison operations of 1st, 3rd, 4th, 6th, 7th, 9th and 10th bits. Each of the switches SW0, SW2, SW3, SW5, SW6, SW8 and SW9 configures a first class switching circuit.

The switches SW1, SW4 and SW7 respectively couple the other electrodes of the capacitors CP1, CP4 and CP7 to the input terminal T2 during normal comparison operations of 2nd, 5th and 8th bits. Further, the switches SW1, SW4 and SW7 respectively couple the other electrodes of the capacitors CP1, CP4 and CP7 to the input terminal T0, T1, T2 or T3 during redundant comparison operations of 2nd, 5th and 8th bits. Each of the switches SW1, SW4 and SW7 configures a second class switching circuit.

Figure 6:
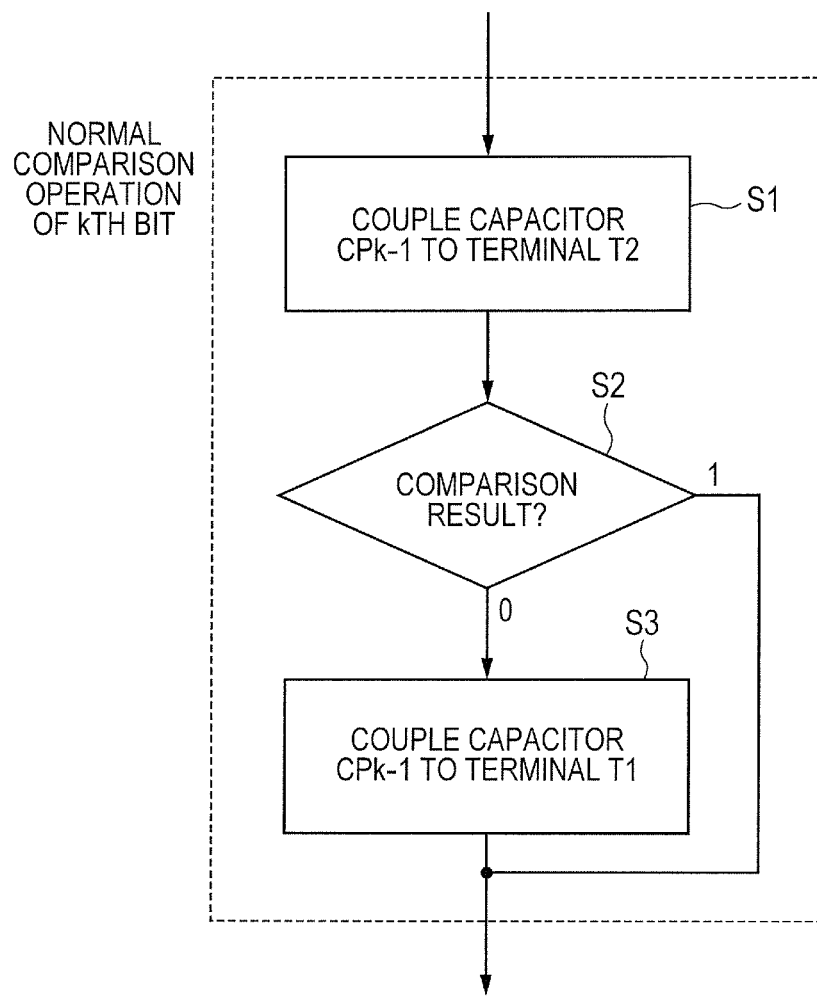
FIG. 6 is a flowchart depicting the operation of the capacitor array shown in FIG. 5.

FIG. 6 is a flowchart showing the normal comparison operation of the capacitor array 17 at a kth bit (where k: 1, 3, 4, 6, 7, 9 or 10). In the initial state, the other terminals of the capacitors CP0 through CP9 are assumed to be coupled to the terminal T1 by the switches SW0 through SW9. In this case, the analog reference signal VAR becomes a reference voltage VRn.

At Step S1, the other terminal of the capacitor CPk−1 is coupled to the input terminal T2. When k=10, for example, the other terminal of the capacitor CP9 is coupled to the input terminal T2 so that the voltage between the reference voltage VR (n+1) and the reference voltage VRn is divided by the capacitor CP9 and a parallel-coupled assembly of the capacitors DCP and CP0 through CP8. Thus, the analog reference signal VAR becomes VRn+[VR (n+1)−VRn]/2.

At Step S2, the magnitude of the analog pixel signal VA and the magnitude of the analog reference signal VAR are compared with each other. It is determined whether the result of comparison is "0" or "1". When the result of comparison is "0" (when VA<VAR), the other electrode of the capacitor CPk−1 is coupled to the terminal T1 at Step S3. When the result of comparison is "1" (when VA>VAR), the state that the other electrode of the capacitor CPk−1 is coupled to the terminal T2 is maintained.

For example, when only the other terminal of the capacitor CP0 is coupled to the terminal T2, and the other electrodes of all remaining capacitors CP1 through CP9 are coupled to the terminal T1, the analog reference signal VAR becomes VRn+[VR (n+1⁻)−VRn]/$2^{10}$. Further, when only the other electrode of the capacitor CP0 is coupled to the terminal T1, and the other electrodes of all remaining capacitors CP1 through CP9 are coupled to the terminal T2, the analog reference signal VAR becomes VR (n+1)−[VR (n+1)−VRn]/$2^{10}$.

Figure 7:
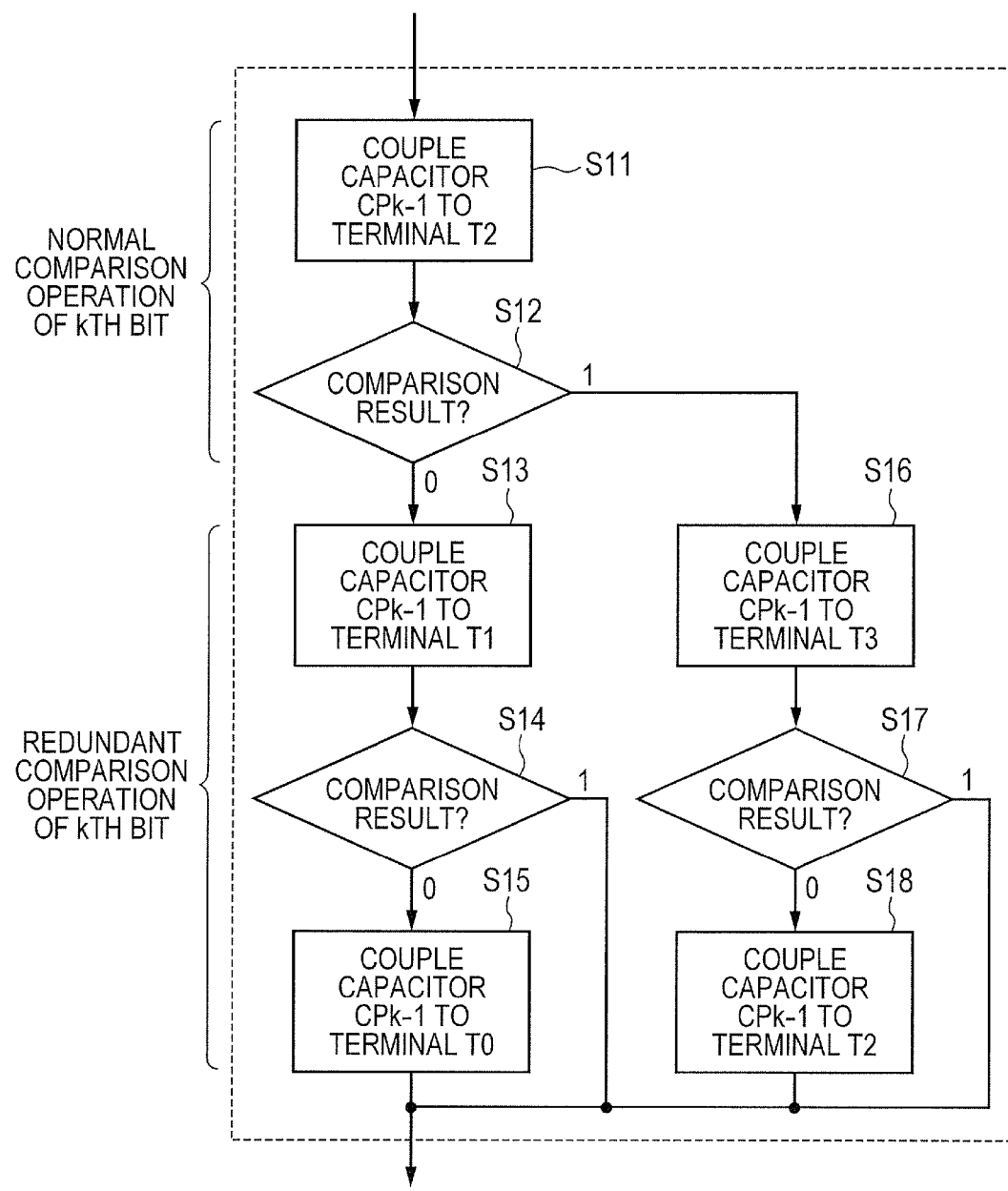
FIG. 7 is a flowchart showing another operation of the capacitor array shown in FIG. 5.

FIG. 7 is a flowchart showing the comparison operation of the capacitor array 17 at a kth bit (where k: 2, 5 or 8). In the initial state, the other terminals of the capacitors CP0 through CP9 are assumed to be coupled to the terminal T1 by the switches SW0 through SW9. In this case, the analog reference signal VAR becomes a reference voltage VRn.

At Step S11, the other terminal of the capacitor CPk−1 is coupled to the input terminal T2. When k=8, for example, the other terminal of the capacitor CP7 is coupled to the input terminal T2 so that the voltage between the reference voltage VR (n+1) and the reference voltage VRn is divided by the capacitor CP7 and a parallel-coupled assembly of the capacitors DCP, CP0 through CP6, CP8 and CP9. Thus, the analog reference signal VAR becomes VRn+[VR (n+1)−VRn]/8.

At Step S12, the magnitude of the analog pixel signal VA and the magnitude of the analog reference signal VAR are compared with each other. It is determined whether the result of comparison is "0" or "1". When the result of comparison is "0" (when VA<VAR), the other electrode of the capacitor CPk−1 is coupled to the terminal T1 at Step S13. At this time, the analog reference signal VAR becomes VRn.

At Step S14, the magnitude of the analog pixel signal VA and the magnitude of the analog reference signal VAR are compared with each other. It is determined whether the result of comparison is "0" or "1". When the result of comparison is "0" (when VA<VAR), the other electrode of the capacitor CPk−1 is coupled to the terminal T0 at Step S15. In this case, the compared results of twice are "00".

When k=8, for example, the other terminal of the capacitor CP7 is coupled to the input terminal T0 so that the voltage between the reference voltage VRn and the reference voltage VR (n−1) is divided by the parallel-coupled assembly of the capacitors DCP, CP0 through CP6, CP8 and CP9 and the capacitor CP7. Thus, the analog reference signal VAR becomes VRn+[VR−VR (n−1)]/8=VRn−[VR (n+1)−VRn]/8.

When the result of comparison is "1" (when VA>VAR) at Step S14, the state that the other electrode of the capacitor CPk−1 is coupled to the input terminal T1 is maintained. In this case, the compared results of twice are "01". When k=8, for example, the other terminal of the capacitor CP7 is coupled to the input terminal T1 and the analog reference signal VAR becomes VRn.

When the result of comparison is "1" (VA>VAR) at Step S12, the other electrode of the capacitor CPk−1 is coupled to the input terminal T3 at Step S16. When k=8, for example, the other terminal of the capacitor CP7 is coupled to the input terminal T3 so that the voltage between the reference voltage VR (n+2) and the reference voltage VRn is divided by the capacitor CP7 and the parallel-coupled assembly of the capacitors DCP, CP0 through CP6, CP8 and CP9. Thus, the analog reference signal VAR becomes VRn+[VR (n+2)−VRn]/8=VRn+[VR (n+1)−VRn]/4.

At Step S17, the magnitude of the analog pixel signal VA and the magnitude of the analog reference signal VAR are compared with each other. It is determined whether the result of comparison is "0" or "1". When the result of comparison is "0" (when VA<VAR), the other electrode of the capacitor CPk-1 is coupled to the terminal T2 at Step S18. In this case, the compared results of twice are "10".

When k=8, for example, the other terminal of the capacitor CP7 is coupled to the input terminal T2 so that the voltage between the reference voltage VR (n+1) and the reference voltage VRn is divided by the capacitor CP7 and the parallel-coupled assembly of the capacitors DCP, CP0 through CP6, CP8 and CP9. Thus, the analog reference signal VAR becomes VRn+[VR−VR (n−1)]/8.

When the result of comparison is "1" (when VA>VAR) at Step S17, the state that the other electrode of the capacitor CPk−1 is coupled to the input terminal T3 is maintained. In this case, the compared results of twice are "11". When k=8, for example, the other terminal of the capacitor CP7 is coupled to the input terminal T3 and the analog reference signal VAR becomes VRn+[VR (n+1)−VRn]/4.

Figure 8:
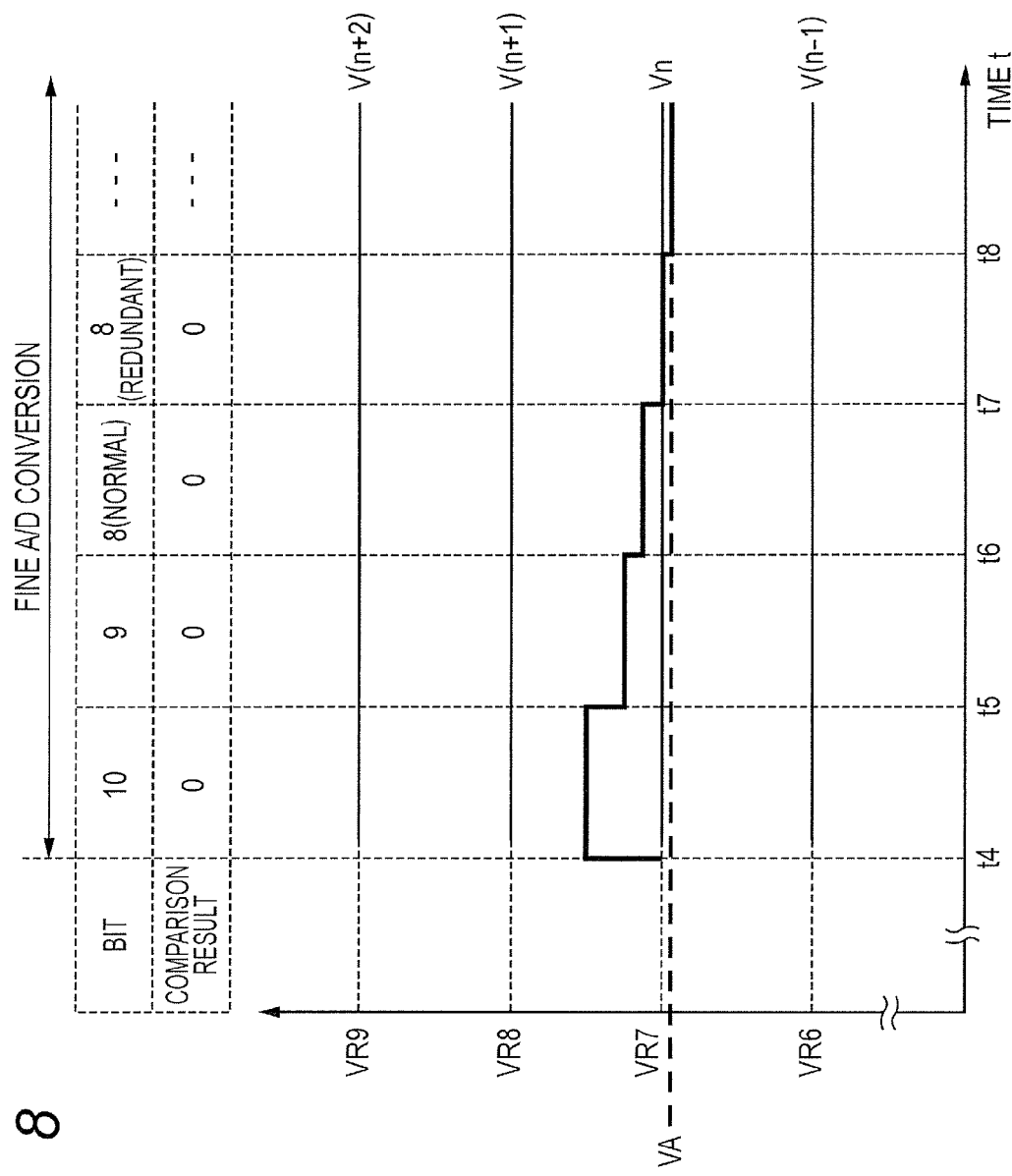
FIG. 8 is a time chart showing a fine A/D conversion operation of the successive comparison type A/D converter shown in FIG. 3.

FIG. 8 is a time chart illustrating the operation of the successive comparison type A/D converter 5 at the time of the fine A/D conversion. In FIG. 8, in the successive comparison type A/D converter 5, the reference voltages VR6 through VR9 are selected as the reference voltages V (n−1) through V (n+2) in the coarse A/D conversion before the time t4.

FIG. 8 shows a case where the voltage of the analog pixel signal VA is only slightly lower than the reference voltage VR7. In a 10th-bit decision (time t4 to t5), the intermediate voltage VR7+(VR8−VR7)/2 between the reference voltages VR7 and VR8 is used as an analog reference signal VAR, and the magnitude of the analog pixel signal VA and the magnitude of the analog reference signal VAR are compared with each other. Since VAR>VA here, a data signal of a 10th bit becomes "0".

Since the data signal of the 10th bit is "0", in a 9th-bit decision (time t5 to t6), VR7+(VR8−VR7)/4 is used as the analog reference signal VAR, and the magnitude of the reference voltage VR4 and the magnitude of the analog pixel signal VA are compared with each other. Since VAR<VA here, the data signal of the 10th bit becomes "0".

Since a data signal of a 9th bit is "0", in an 8th-bit normal comparison operation (time t6 to t7), VR7+(VR8−VR7)/8 is used as the analog reference signal VAR, and the magnitude of the reference voltage VR4 and the magnitude of the analog pixel signal VA are compared with each other. Since VAR>VA here, a normal comparison result of an 8th bit becomes "0".

Since the 8th-bit normal comparison result is "0", the reference voltage VR7 is used as the analog reference signal VAR, and the magnitude of the reference voltage VR7 and the magnitude of the analog pixel signal VA are compared with each other during the 8th-bit redundant comparison operation as shown in FIG. 7. Since VAR>VA here, the redundant comparison result of the 8th bit becomes "0". Since the comparison result of the 8th bit becomes "00", the other terminal of the capacitor CP7 is coupled to the input terminal T0 as shown in FIG. 7. Thus, the analog reference signal VAR can be set lower than the reference voltage VR7.

FIG. 9 is a diagram showing the relationship between two compared results of a kth bit (where k: 2, 5 or 8) and an output code. When the normal comparison result of the kth bit and the redundant comparison result thereof are respectively "00" in FIG. 9, the output code becomes $-2^{k-1}$. Then, when the normal comparison result of the kth bit and the redundant comparison result thereof are respectively "01", the output code becomes 0. Further, when the normal comparison result of the kth bit and the redundant comparison result thereof are respectively "10", the output code becomes $2^{k-1}$. Furthermore, when the normal comparison result of the kth bit and the redundant comparison result thereof are respectively "11", the output code becomes $2^k$. For example, when the comparison result is 00, 01, 10 and 11 where k=8, the output code becomes $-2^7$, 0, $2^7$ and $2^8$ respectively.

FIG. 10 is a diagram showing the relationship between two compared results of a kth bit (where k: 2, 5 or 8) where the selected subrange region is the uppermost subrange region or the lowermost subrange region, and an output code. FIG. 10 is a diagram compared to FIG. 9.

When the uppermost subrange region is selected, VR (n−1) through VR (n+2) become VR14, VR15, VR16 and VR16 respectively as can be seen from FIG. 4. Therefore, even when the result of comparison is 11, the output code becomes $2^{k-1}$. Further, when the lowermost subrange region is selected, VR (n−1) through VR (n−2) become VR0, VR0, VR1 and VR2 as can be seen from FIG. 4. Therefore, even when the result of comparison is 00, the output code becomes 0.

Figure 11:
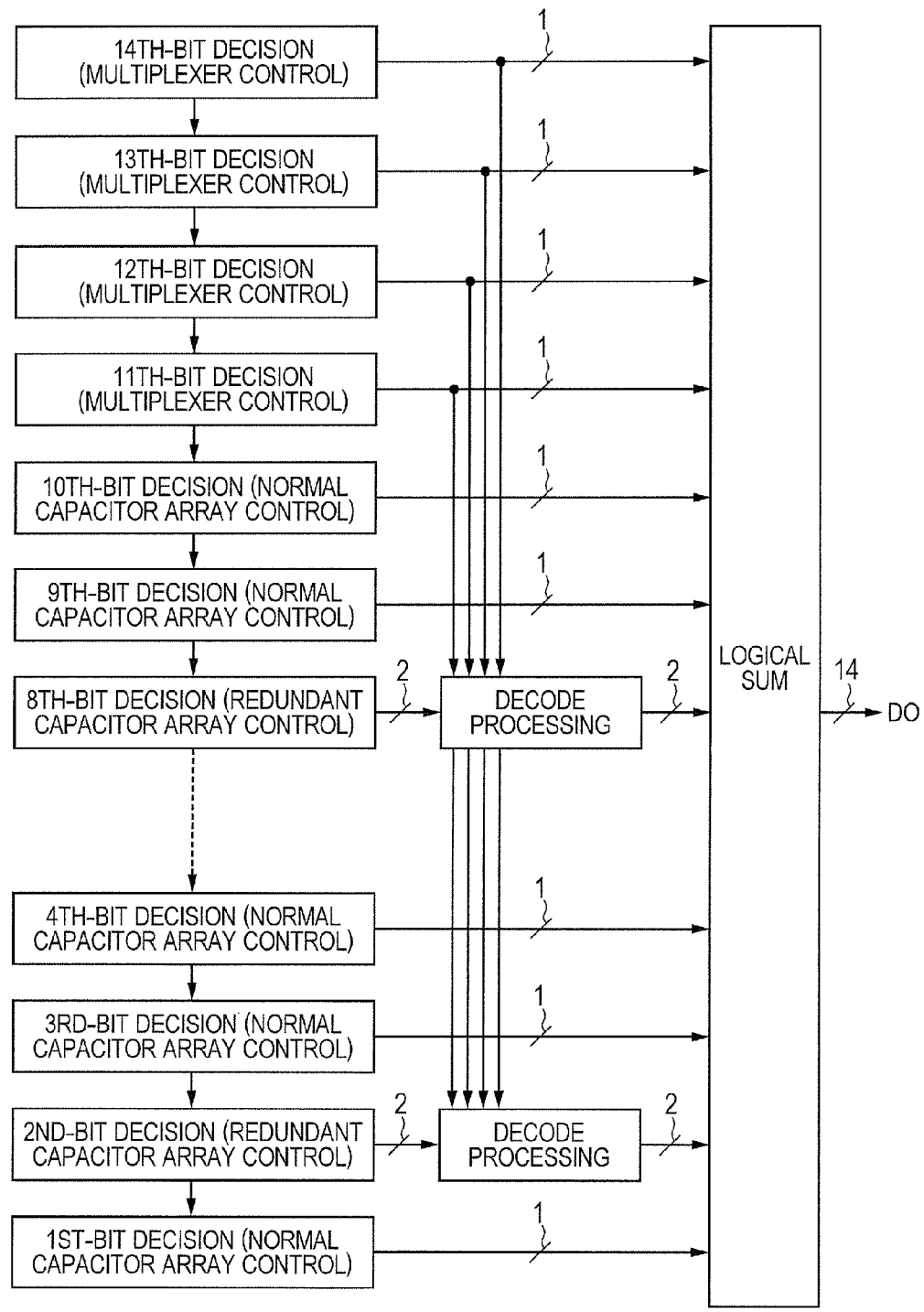
FIG. 11 is a diagram showing an algorithm of an A/D conversion in the solid-state imaging apparatus shown in FIG. 1.

FIG. 11 is a diagram showing an algorithm of an A/D conversion. In FIG. 11, in the 14th-bit to 11th-bit decisions, the normal binary search is executed by controlling the multiplexer 16 to thereby select a subrange region to which the analog pixel signal VA belongs, and subrange regions positioned above and below the subrange region. In other words, the reference voltages VR (n−1) through VR (n+2) are selected and applied to the capacitor array 17. Further, each of the normal comparison results of the 14th through 11th bits becomes a 1-bit data signal.

In the 10th and 9th bits, the normal binary search is executed by controlling the capacitor array 17 to obtain data signals of the 10th and 9th bits. At this time, the capacitor array 17 generates an analog reference signal VAR using the reference voltages VRn and VR (n+1).

In the 8th bit, a redundant decision is performed by controlling the capacitor array 17. In the redundant decision, the normal comparison operation and the redundant comparison operation are executed, and the compared results of twice become a data signal in 2 bits. During the normal comparison operation, the capacitor array 17 applies the reference voltage VR (n+1) to the other electrode of the capacitor CP7 to update the analog reference signal VAR and compares the magnitudes of the analog pixel signal VA and the analog reference signal VAR. During the normal comparison operation, the capacitor array 17 applies the reference voltages VR (n−1), VRn, VR (n+1) or VR (n+2) to the other electrode of the capacitor CP7 to update the analog reference signal VAR and compares the magnitudes of the analog pixel signal VA and the analog reference signal VAR.

7th-bit to 5th-bit decisions are respectively similar to the 10th-bit to 8th-bit decisions. 4th-bit to 2nd-bit decisions are respectively similar to the 10th-bit to 8th bit decisions. A 1st-bit decision is similar to the 10th-bit decision.

The decode processing shown in each of FIGS. 9 and 10 is performed on the compared results of twice of each of the 8th, 5th and 2nd bits to generate data signal of 2 bits. When all data signals of 14 to 11 bits are "1" upon the decode processing, the uppermost subrange region is selected and hence the output code for the uppermost subrange is used as shown in FIG. 10. Further, when all of the data signals of 14 to 11 bits are "0" upon the decode processing, the lowermost subrange region is selected and hence the output code for the lowermost subrange is used as shown in FIG. 10.

Data signals of 17 bits are generated by the 14th-bit to 1st-bit decisions. The logical sum of the 17-bit data signals becomes a 14-bit digital pixel signal DO. The decode processing and the logical sum are performed by the signal processing circuit 7 of FIG. 1.

In the first embodiment, when the coarse A/D conversion is performed, any of the reference voltages VR1 through VR16 is selected and set as the analog reference signal VAR. Further, when the fine A/D conversion is performed, the reference voltages VR (n−1) through VR (n+2) of the reference voltages VR1 through VR16 are selected, and the analog reference signal VAR is generated based on those reference voltages. Thus, settling errors in the reference voltage VR can be reduced without using external decoupling capacitors and redundant capacitors arranged every plural columns, thus making it possible to achieve miniaturization and cost-reduction of the apparatus.

Incidentally, in the first embodiment, the coarse A/D conversion is set to 4 bits, but not limited thereto. Further, the fine A/D conversion is set to 10 bits, but not limited thereto. The redundant determination is executed in the 3-bit cycle, but not limited thereto.

Second Embodiment

Figure 12:
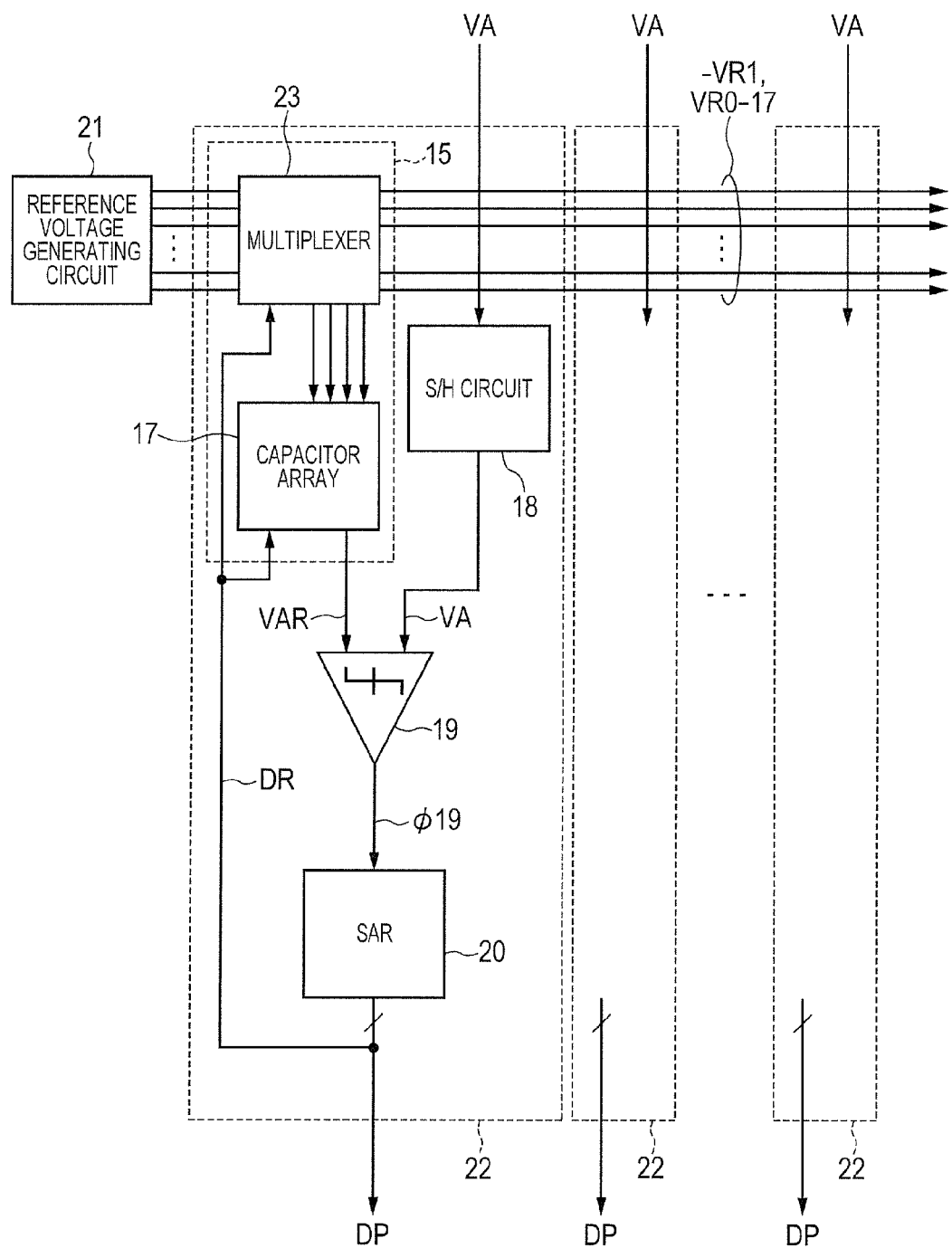
FIG. 12 is a block diagram depicting a main part of a solid-state imaging apparatus according to a second embodiment of the present application.

FIG. 12 is a block diagram showing a main part of a solid-state imaging apparatus according to a second embodiment of the present application and a diagram compared to FIG. 3. Referring to FIG. 12, the present solid-state imaging apparatus is different from the solid-state imaging apparatus according to the first embodiment in that the reference voltage generating circuit 4 and the successive comparison type A/D converter 5 are respectively replaced with a reference voltage generating circuit 21 and a successive comparison type A/D converter 22. Further, the successive comparison type A/D converter 22 is a replacement of the multiplexer 16 of the successive comparison type A/D converter 5 with the successive comparison type A/D converter 22.

The reference voltage generating circuit 21 generates reference voltages −VR1 and VR0 through VR17 of 19 stages. During a normal comparison operation for a period in which a coarse A/D conversion is performed, the multiplexer 23 selects any of the reference voltages VR0 through VR16 in accordance with a digital reference signal DR from a successive approximation register 20 and applies the reference voltage to a comparator 19 as an analog reference signal VAR.

Further, when a fine A/D conversion is performed, the multiplexer 23 selects the reference voltages VR (n−1) through VR (n+2) out of the reference voltages −VR1 and VR0 through VR17 in accordance with the digital reference signal DR and applies those reference voltages to a capacitor array 17.

Figure 13:
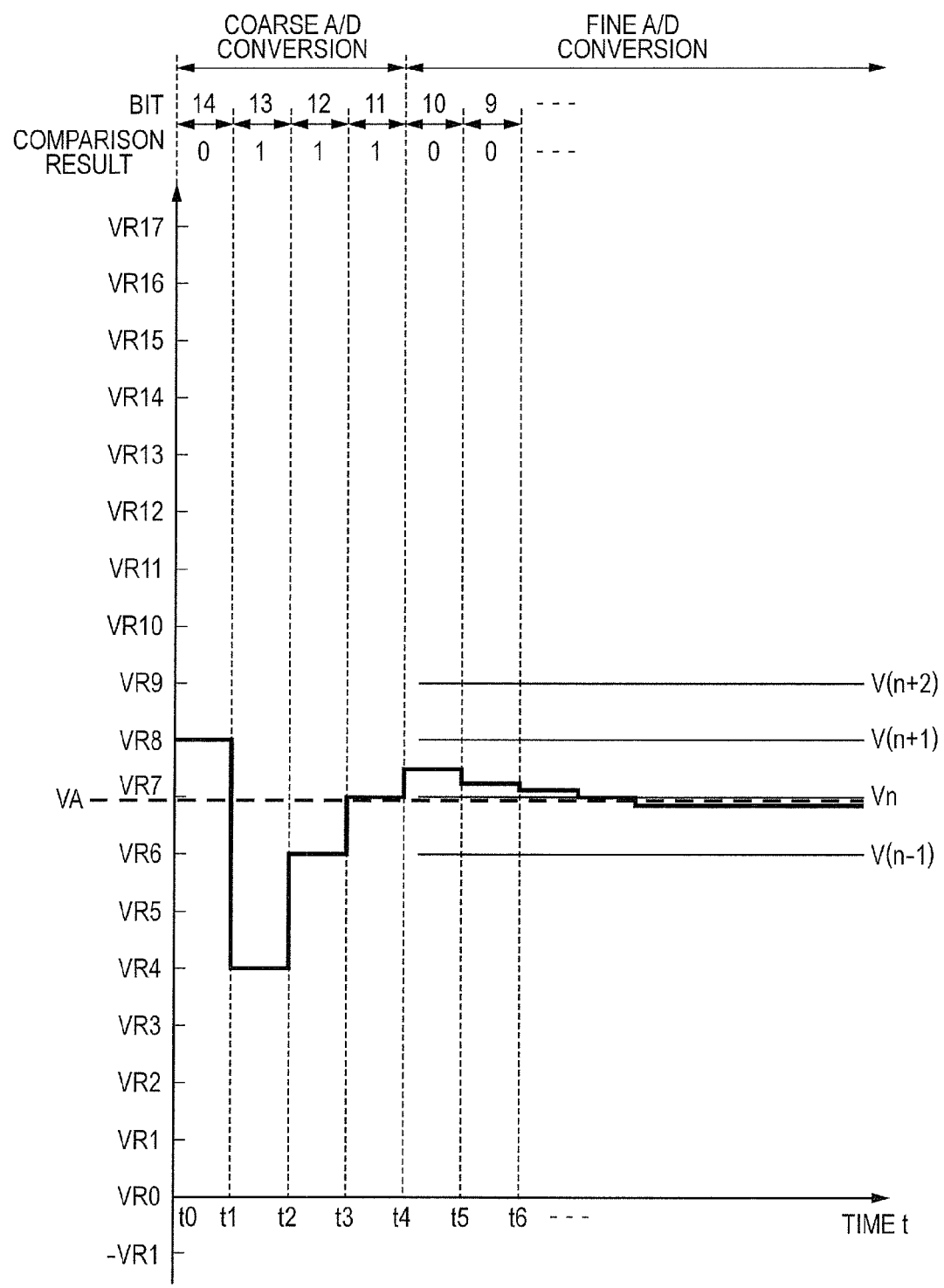
FIG. 13 is a time chart showing the operation of a successive comparison type A/D converter shown in FIG. 12.
Figure 14:
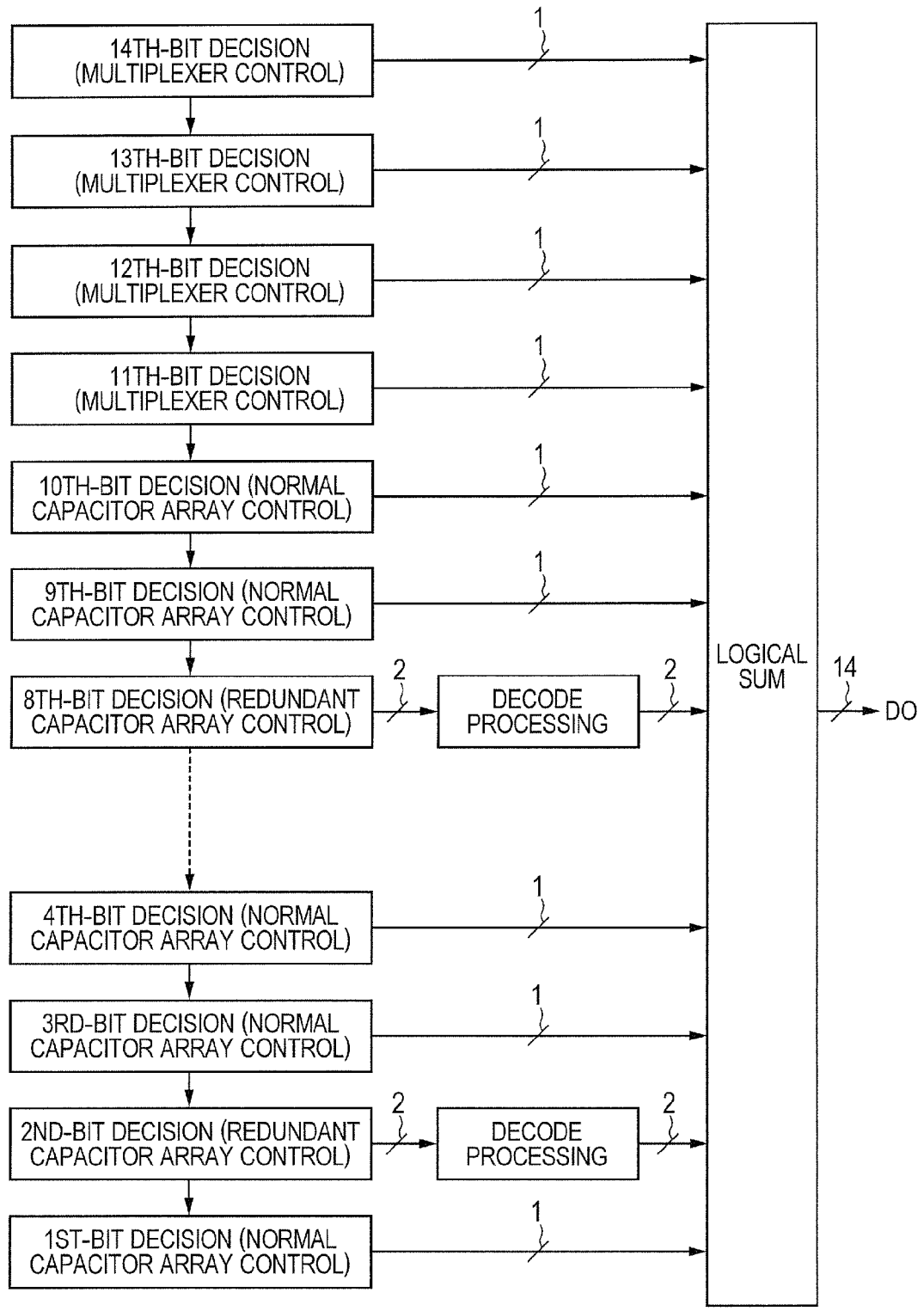
FIG. 14 is a diagram illustrating an algorithm of an A/D conversion in the solid-state imaging apparatus described in FIG. 12.

FIG. 13 is a time chart showing the operation of the successive comparison type A/D converter 22 and a diagram compared to FIG. 4. FIG. 14 is a diagram showing an algorithm of an A/D conversion and a diagram compared to FIG. 11. In FIGS. 13 and 14, the solid-state imaging apparatus is provided with an upper overrange region (VR16 to VR17) located above the uppermost subrange region and a lower overrange region (−VR1 to VR0) located below the lowermost subrange region. Therefore, even when the uppermost subrange region or the lowermost subrange region is selected as a subrange region to which an analog pixel signal VA belongs, decode processing can be performed without referring to decision results of 14th to 11th bits and hence simplification thereof can be achieved. That is, the table of FIG. 10 becomes unnecessary and the table of FIG. 9 is enough if it is used.

Third Embodiment

Figure 15:
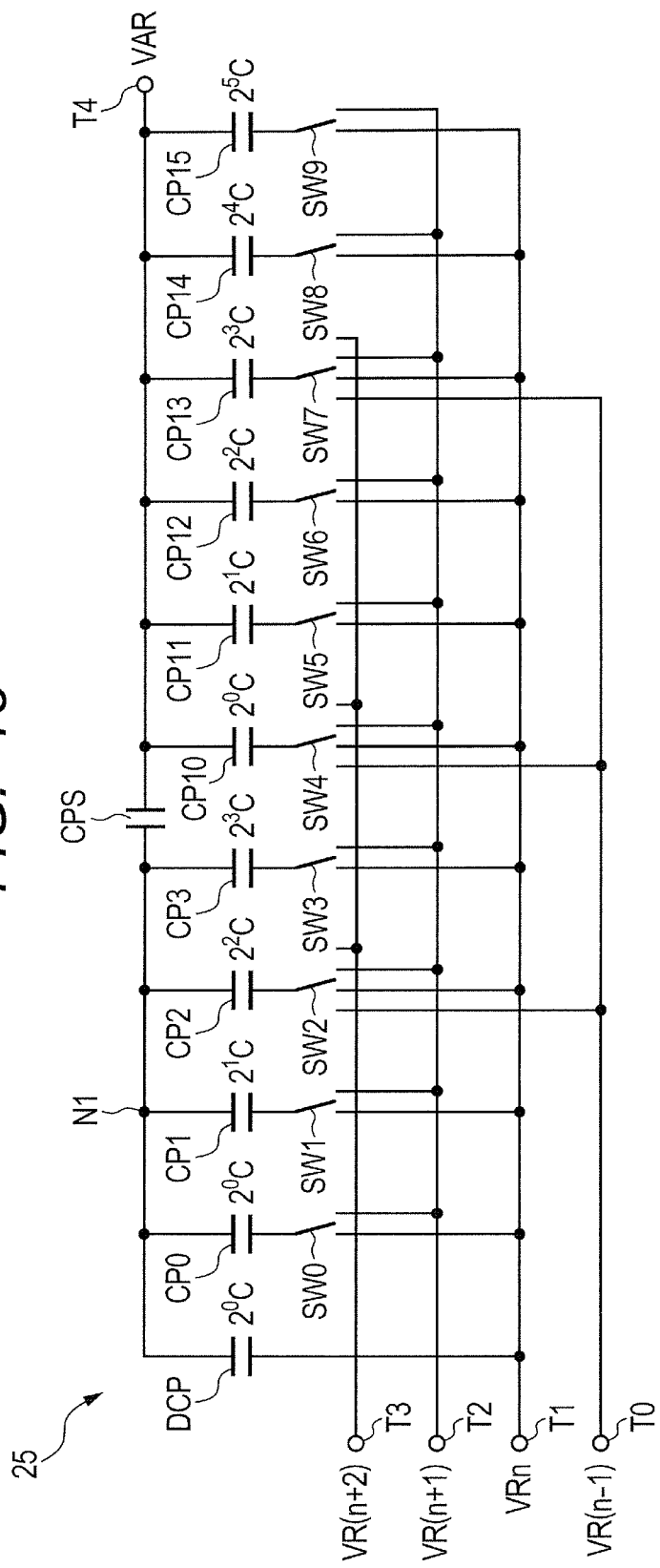
FIG. 15 is a circuit diagram showing a main part of a solid-state imaging apparatus according to a third embodiment of the present application.

FIG. 15 is a circuit diagram showing a main part of a solid-state imaging apparatus according to a third embodiment of the present application and a diagram compared to FIG. 5. Referring to FIG. 15, the present solid-state imaging apparatus is different from the solid-state imaging apparatus according to the first embodiment in that the capacitor array 17 is replaced with a capacitor array 25.

The capacitor array 25 includes input terminals T0 through T3, an output terminal T4, a dummy capacitor DCP, a split capacitor CPS, capacitors CP0 through CP3 and CP10 through CP15, and switches SW0 through SW9.

The input terminals T0 through T3 respectively receive reference voltages VR (n−1) through VR (n+2). An analog reference signal VAR appears in the output terminal T4. The dummy capacitor DCP is coupled between a node N1 and the input terminal T1. One electrodes of the capacitors CP0 through CP3 are coupled to the node N1. The split capacitor CPS is coupled between the node N1 and the output terminal T4. If the capacitance value of the capacitor CP0 is taken to be $2^0$C, the capacitance values of the capacitors CP1 through CP3 are respectively set to $2^1$C through $2^3$C, and the capacitance value of the dummy capacitor DCP is set to $2^0$C The sum of the capacitance values of the capacitors DCP and CP0 through CP3 becomes $2^4$C. The capacitance value of the split capacitor CPS is set to about $2^0$C One electrodes of the capacitors CP10 through CP15 are coupled to the output terminal T4. If the capacitance value of the capacitor CP10 is taken to be $2^0$C, the capacitance values of the capacitors CP11 through CP15 are set to $2^1$C through $2^5$C. The sum of the capacitance values of the capacitors DCP and CP0 through CP3 becomes $(2^6-1)$C.

The switches SW0, SW2, SW3, SW5, SW6, SW8 and SW9 respectively couple the other electrodes of the capacitors CP0, CP2, CP3, CP11, CP12, CP14 and CP15 to the input terminal T1 or T2 during normal comparison operations of 1st, 3rd, 4th, 6th, 7th, 9th and 10th bits.

The switches SW1, SW4 and SW7 respectively couple the other electrodes of the capacitors CP11, CP10 and CP13 to the input terminal T2 during normal comparison operations of 2nd, 5th and 8th bits. Further, the switches SW1, SW4 and SW7 respectively couple the other electrodes of the capacitors CP1, CP10 and CP13 to the input terminal T0, T1, T2 or T3 during redundant comparison operations of 2nd, 5th and 8th bits.

For example, during the normal comparison operation of the 10th bit, the other electrodes of the capacitors CP0 through CP3 and CP10 through CP14 are coupled to the input terminal T1, and the other electrode of the capacitor CP15 is coupled to the input terminal T2. Thus, the analog reference signal VAR becomes [VR (n+1)−VRn]/2.

In the third embodiment, it is possible to bring the size of the capacitor array 25 to about 1/13 of the size of the capacitor array 17 and reduce a chip area.

Incidentally, in the third embodiment, the split capacitor CPS is provided between the upper 6 bits and the lower 4 bits, but not limited to it. The split capacitor CPS may be provided in another position.

Fourth Embodiment

Figure 16:
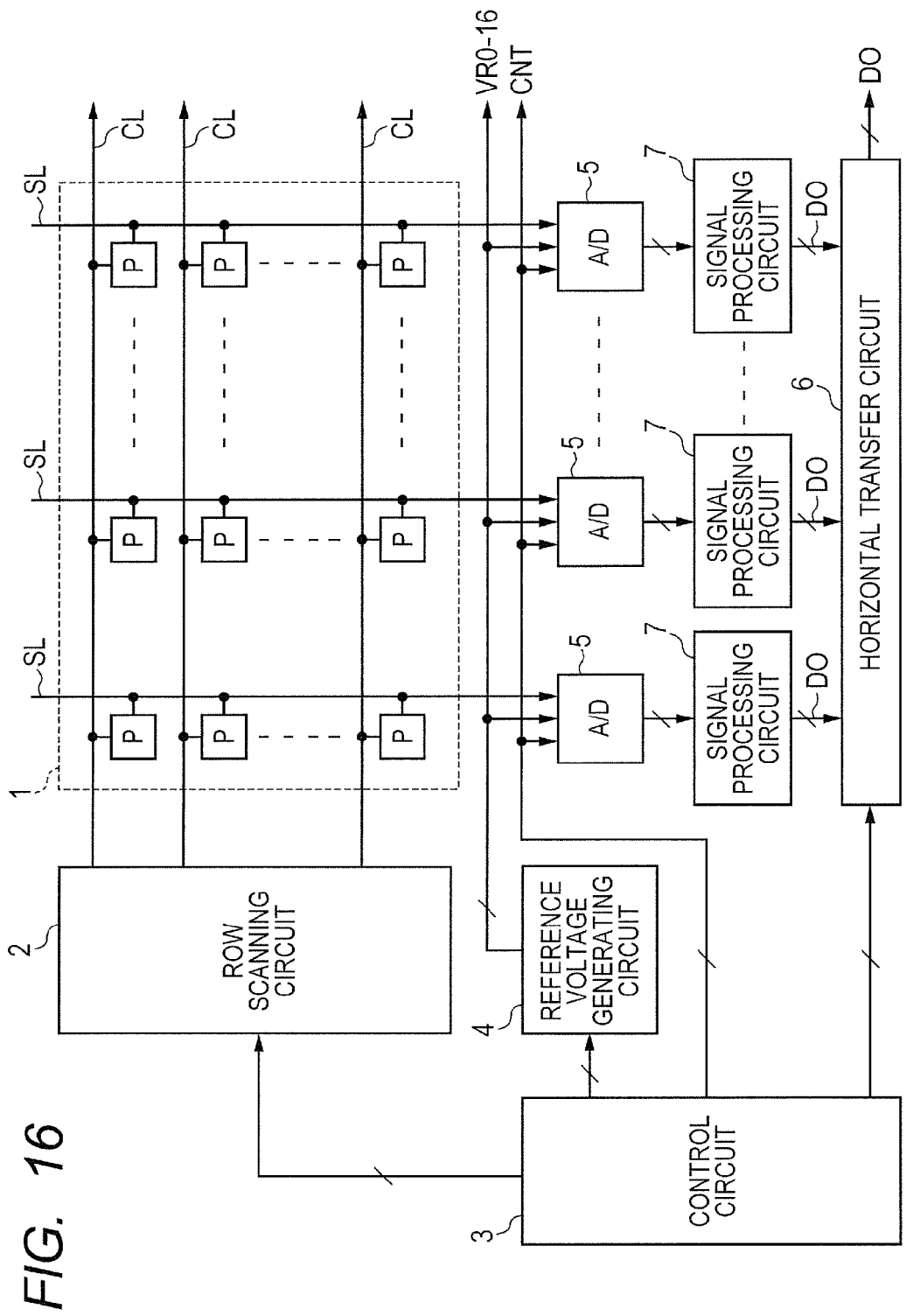
FIG. 16 is a block diagram illustrating a configuration of a solid-state imaging apparatus according to a fourth embodiment of the present application.

FIG. 16 is a circuit diagram showing the configuration of a solid-state imaging apparatus according to a fourth embodiment of the present application and a diagram compared to FIG. 1. Referring to FIG. 16, the present solid-state imaging apparatus is different from the solid-state imaging apparatus according to the first embodiment in that signal processing circuits 7 are provided corresponding to individual columns.

Each of the signal processing circuits 7 generates a 14-bit digital pixel signal DO, based on a 17-bit digital pixel signal DP generated by its corresponding A/D converter 5 and applies the generated digital pixel signal DO to a horizontal transfer circuit 6.

The horizontal transfer circuit 6 temporarily holds a plurality of digital pixel signals DO corresponding to one row supplied from a plurality of the signal processing circuits 7 and thereafter sequentially outputs the held digital pixel signals DO to the outside one by one.

In the fourth embodiment, the number of bits of each signal transferred by the horizontal transfer circuit 6 can be reduced as compared with the first embodiment. However, the number of the signal processing circuits 7 increases and the circuit scale becomes large.

Fifth Embodiment

Figure 17:
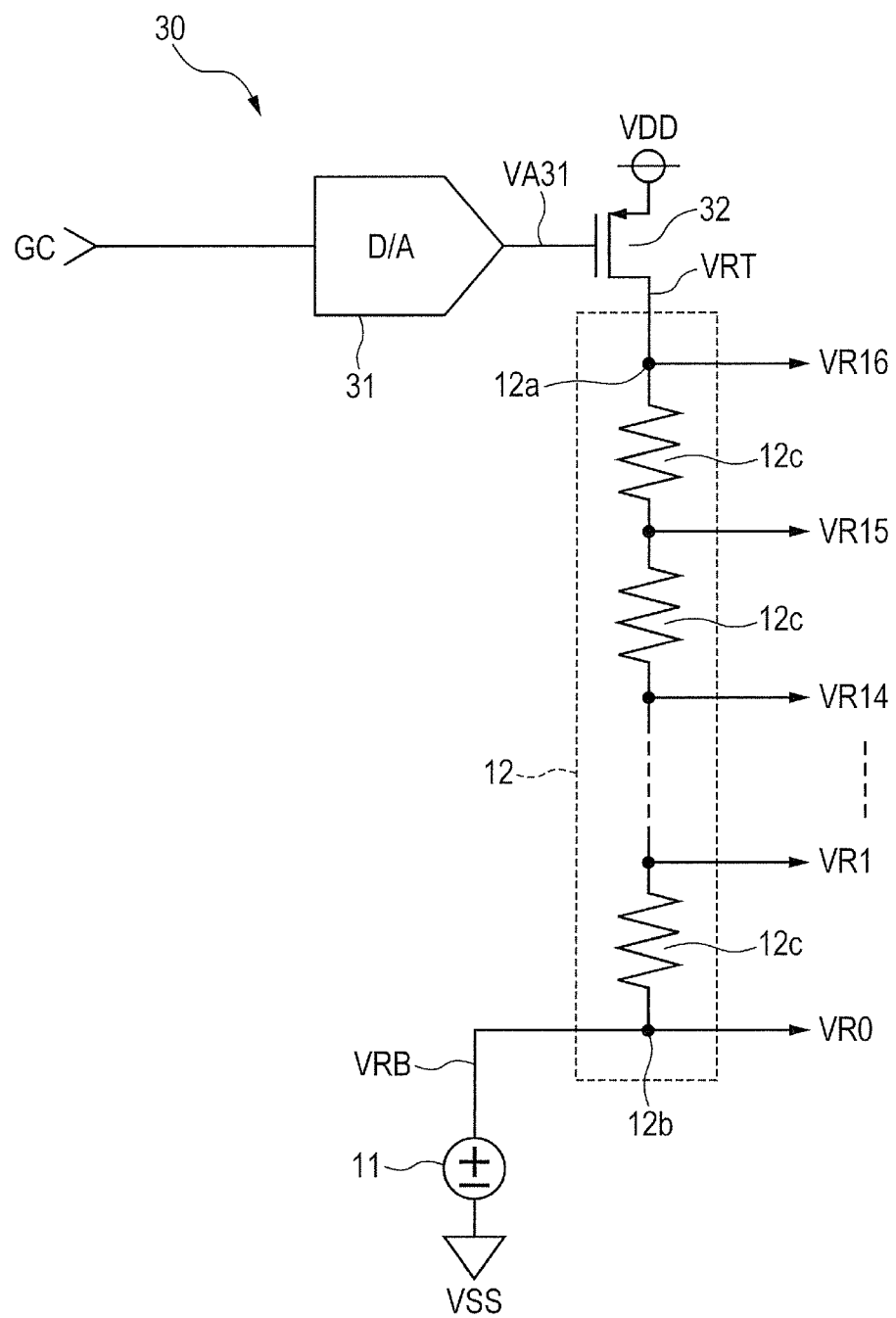
FIG. 17 is a circuit diagram showing a configuration of a reference voltage generating circuit included in a solid-state imaging apparatus according to a fifth embodiment of the present application.

FIG. 17 is a circuit diagram showing a main part of a solid-state imaging apparatus according to a fifth embodiment of the present application and a diagram compared to FIG. 2. Referring to FIG. 17, the present solid-state imaging apparatus is different from the solid-state imaging apparatus according to the first embodiment in that the reference voltage generating circuit 4 is replaced with a reference voltage generating circuit 30.

The reference voltage generating circuit 30 is a replacement of the constant voltage source 10 of the reference voltage generating circuit 4 with a D/A converter 31 and a P channel MOS transistor 32. The D/A converter 31 and the P channel MOS transistor 32 configure a variable current source. The D/A converter 31 converts a gain control signal GC to an analog signal VA31. A digital value of the gain control signal GC is changed according to the brightness of a subject, for example. When the digital value of the gain control signal GC is increased, the voltage of a difference between a power supply voltage VDD and the analog signal VA31 is increased. The source of the P channel MOS transistor 32 receives the power supply voltage VDD therein, the drain thereof is coupled to one terminal 12a of a ladder resistor 12, and the gate thereof receives an output signal of the D/A converter 31.

When the digital value of the gain control signal GC is increased and the voltage of the difference between the power supply voltage VDD and the analog signal VA31 is increased, the value of conduction resistance of the P channel MOS transistor 32 is reduced so that the current flowing through the ladder resistor 12 increases. Thus, the voltage between the terminals 12a and 12b of the ladder resistor 12 increases and hence reference voltages VR1 through VR16 rise.

Reversely, when the digital value of the gain control signal GC is decreased and the voltage of the difference between the power supply voltage VDD and the analog signal VA31 is decreased, the value of conduction resistance of the P channel MOS transistor 32 is increased so that the current flowing through the ladder resistor 12 is reduced. Thus, the voltage between the terminals 12a and 12b of the ladder resistor 12 is decreased so that the reference voltages VR1 through VR16 are lowered. Incidentally, the reference voltage VR0 is fixed to an output voltage VRB of a constant voltage source 11.

In the fifth embodiment, it is possible to change the levels of the reference voltage VR0 through VR16 and switch the gain of the A/D converter 5.

Incidentally, in the fifth embodiment, the constant voltage source 10 of the reference voltage generating circuit 4 is replaced with the constant current source comprised of the D/A converter 31 and the transistor 32, but the constant voltage source 11 of the reference voltage generating circuit 4 may be replaced with a constant current source comprised of a D/A converter and a transistor.

Sixth Embodiment

Figure 18:
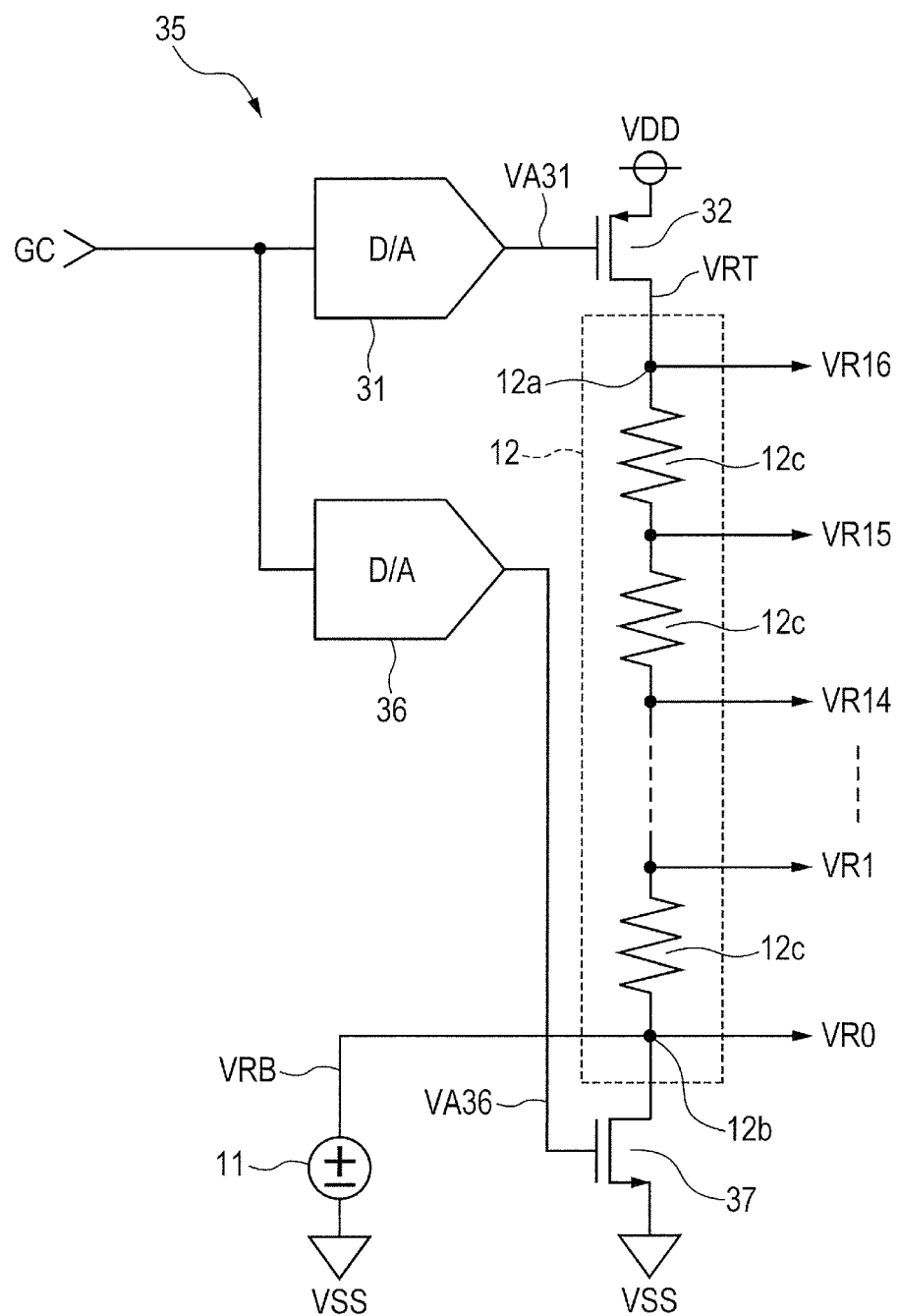
FIG. 18 is a circuit diagram illustrating a configuration of a reference voltage generating circuit included in a solid-state imaging apparatus according to a sixth embodiment of the present application.

FIG. 18 is a circuit diagram showing the configuration of a reference voltage generating circuit 35 included in a solid-state imaging apparatus according to a sixth embodiment of the present application and a diagram compared to FIG. 17. Referring to FIG. 18, the reference voltage generating circuit 35 is additionally provided additionally with a D/A converter 36 and an N channel MOS transistor 37 to the reference voltage generating circuit 30. The D/A converter 36 and the N channel MOS transistor 37 configure a variable current source. The D/A converter 36 converts a gain control signal GC to an analog signal VA36. When a digital value of the gain control signal GC is increased, the voltage of the analog signal VA36 is increased. The drain of the N channel MOS transistor 37 is coupled to the other terminal 12b of a ladder resistor 12, and the gate thereof receives an output signal of the D/A converter 36.

When the digital value of the gain control signal GC is increased so that the voltage of a difference between a power supply voltage VDD and an analog signal VA31 is increased and the voltage of the analog signal VA36 is increased, the values of conduction resistance of the transistors 32 and 37 are reduced together so that the current flowing through the ladder resistor 12 is increased. Thus, the voltage between terminals 12a and 12b of the ladder resistor 12 is increased and hence the reference voltages VR1 through VR16 rise.

Reversely, when the digital value of the gain control signal GC is decreased so that the voltage of the difference between the power supply voltage VDD and the analog signal VA31 is reduced and the voltage of the analog signal VA36 is decreased, the values of conduction resistance of the transistors 32 and 37 are both increased so that the current flowing through the ladder resistor 12 is decreased. Thus, the voltage between the terminals 12a and 12b of the ladder resistor 12 is decreased so that the reference voltages VR1 through VR16 are lowered. Incidentally, the reference voltage VR0 is fixed to an output voltage VRB of a constant voltage source 11.

In the sixth embodiment, the current is supplied to one terminal 12a of the ladder resistor 12, and current equivalent to the supplied current is drawn from the other terminal 12b of the ladder resistor 12. It is therefore possible to reduce the current flowing through the constant voltage source 11 and easily design the constant voltage source 11.

Seventh Embodiment

Figure 19:
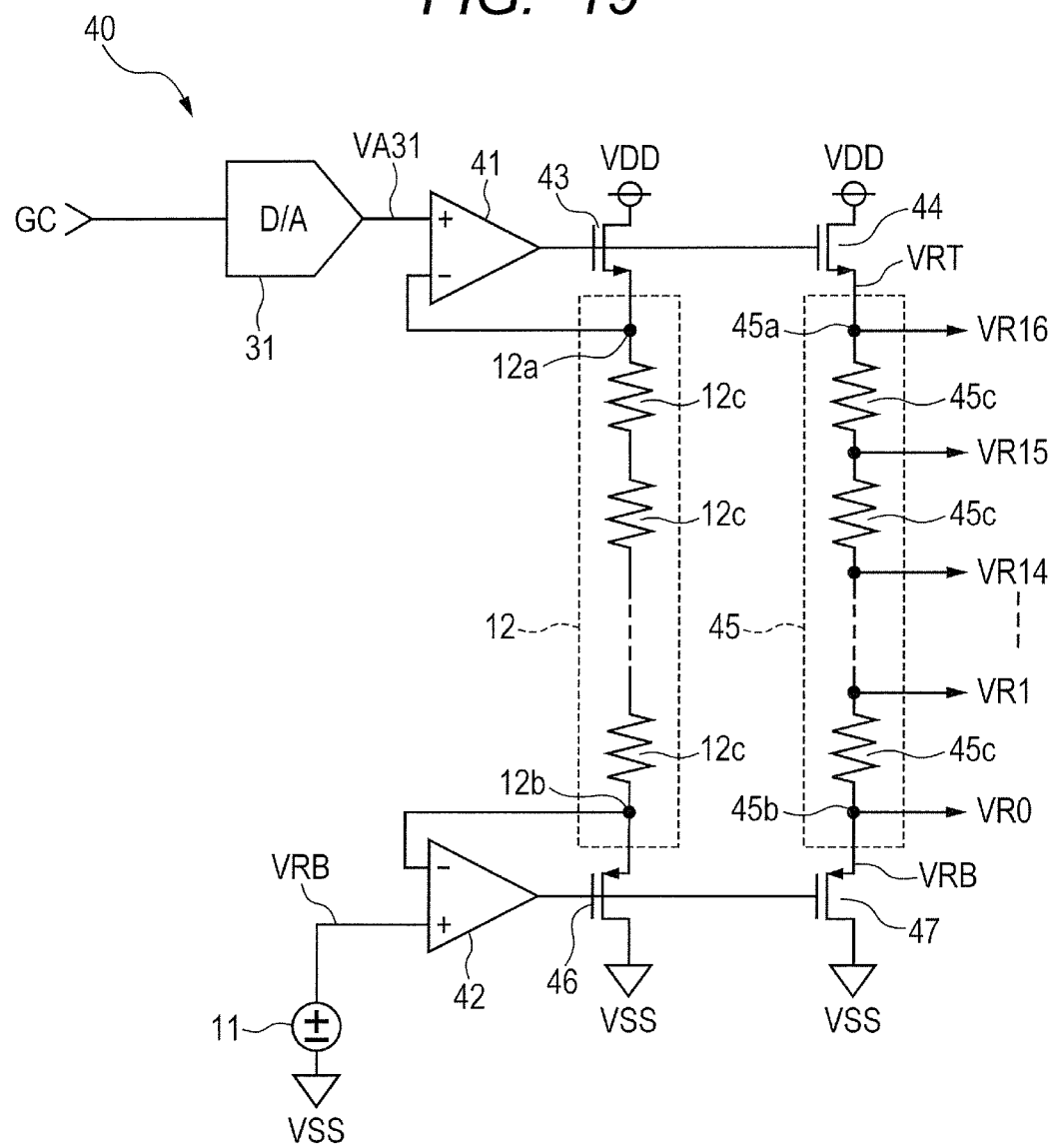
FIG. 19 is a circuit diagram depicting a configuration of a reference voltage generating circuit included in a solid-state imaging apparatus according to a seventh embodiment of the present application.

FIG. 19 is a circuit diagram showing the configuration of a reference voltage generating circuit 40 included in a solid-state imaging apparatus according to a seventh embodiment of the present application and a diagram compared to FIG. 18. Referring to FIG. 19, the reference voltage generating circuit 40 is different from the reference voltage generating circuit 35 in that the D/A converter 36, the P channel MOS transistor 32 and the N channel MOS transistor 37 are eliminated, and operational amplifiers 41 and 42, N channel MOS transistors 43 and 44, a ladder resistor 45 and P channel MOS transistors 46 and 47 are added.

The drain of the N channel MOS transistor 43 is coupled to a line for a power supply voltage VDD, and the source thereof is coupled to one terminal 12a of a ladder resistor 12. The drain of the N channel MOS transistor 44 is coupled to the line for the power supply voltage VDD, and the source thereof is coupled to one terminal 45a of the ladder resistor 45. The source of the P channel MOS transistor 46 is coupled to the other terminal 12b of the ladder resistor 12, and the drain thereof is coupled to a line for a ground voltage VSS. The source of the P channel MOS transistor 47 is coupled to the other terminal 45b of the ladder resistor 45, and the drain thereof is coupled to the line for the ground voltage VSS.

A non-inversion input terminal (+ terminal) of the operational amplifier 41 receives an analog signal VA31, an inversion input terminal (− terminal) thereof is coupled to one terminal 12a of the ladder resistor 12, and an output terminal thereof is coupled to the gates of the N channel MOS transistors 43 and 44. The operational amplifier 41 controls the gate voltage of each of the P channel MOS transistors 43 and 44 in such a manner that the voltage of one terminal 12a of the ladder resistor 12 coincides with an analog signal VA31.

A non-inversion input terminal (+ terminal) of the operational amplifier 42 receives an output voltage VRB of a constant voltage source 11, an inversion input terminal (− terminal) thereof is coupled to the other terminal 12b of the ladder resistor 12, and an output terminal thereof is coupled to the gates of the P channel MOS transistors 46 and 47. The operational amplifier 42 controls the gate voltage of each of the P channel MOS transistors 46 and 47 in such a manner that the voltage of the other terminal 12b of the ladder resistor 12 coincides with the constant voltage VRB.

The size of each of the transistors 44 and 47 is larger than that of each of the transistors 43 and 46. The ratio between the size A of each of the transistors 44 and 47 and the size B of each of the transistors 43 and 46 is set to a prescribed value K=A/B larger than 1. The gates of the transistors 43 and 44 are coupled to each other, and the gates of the transistors 46 and 47 are coupled to each other. Thus, current equivalent to K times the current flowing through the transistors 43 and 46 flows through the transistors 44 and 47. Further, the source voltage of the transistor 44 becomes VRT, and the source voltage of the transistor 47 becomes VRB.

The ladder resistor 45 includes sixteen resistive elements 45c coupled in series between terminals 45a and 45b. The ladder resistor 45 divides the voltage between reference voltages VR16 (=VRT) and VR0 (=VRB) to generate reference voltages VR15 through VR1. The reference voltages VR15 through VR1 become voltages obtained by equally dividing the voltage between the reference voltages VR16 and VR0. The resistance value of the ladder resistor 45 is set to 1/K of the resistance value of the ladder resistor 12. Thus, the output impedance of the ladder resistor 45 is lower than that of the ladder resistor 12.

In the seventh embodiment, the output impedance of the reference voltage generating circuit can be reduced.

Eighth Embodiment

FIG. 20 is a block diagram showing the layout of a solid-state imaging apparatus according to an eighth embodiment of the present application and a diagram compared to FIG. 1. In FIG. 20, the present solid-state imaging apparatus is equipped with a quadrangular semiconductor substrate 50. A pixel array 1 is formed in the center of the semiconductor substrate 50. A direction (transverse direction in FIG. 20) in which the long side of the semiconductor substrate 50 extends is taken to be an X direction, and a direction (longitudinal direction in FIG. 20) in which the short side thereof extends is taken to be a Y direction. The pixel array 1 includes a plurality of pixel circuits P arranged in a matrix form in the X and Y directions. Each of the pixel circuits P outputs an analog pixel signal VA having a voltage corresponding to an incident light quality.

The columns of the pixel circuits P are grouped two by two. Analog pixel signals VA generated by the pixel circuits P selected out of the odd-numbered columns in the column groups are outputted to the upper side in the drawing of the pixel array 1 through signal lines SL (not shown). Analog pixel signals VA generated by the pixel circuits P selected out of the even-numbered columns in the column groups are outputted to the lower side in the drawing of the pixel array 1 through signal lines SL (not shown). A row scanning circuit 2 is disposed on the left side in the drawing of the pixel array 1. A control circuit 3 and a reference voltage generating circuit 4 are disposed adjacent to the row scanning circuit 2.

The row scanning circuit 2 is controlled by the control circuit 3 to sequentially select plural rows by one row and bring a control line CL (not shown) of the selected row to an activation level. Each of the pixel circuits P is activated according to the corresponding control line CL being brought to the activation level and outputs an analog pixel signal VA having a voltage corresponding to an incident light quantity to the corresponding signal line SL (not shown). The control circuit 3 controls the entire solid-state imaging apparatus. The reference voltage generating circuit 4 generates reference voltages VR0 through VR16.

A successive comparison type A/D converter 5a is disposed adjacent to the upper side in the drawing of each column group. A successive comparison type A/D converter 5b is disposed adjacent to the lower side in the drawing of each column group. Each of the successive comparison type A/D converter 5a converts analog pixel signals VA outputted from the pixel circuits P of the odd-numbered column in the corresponding column group to a 17-bit digital pixel signal DP, based on the reference voltages VR0 through VR16. Each of the successive comparison type A/D converters 5b converts analog pixel signals VA outputted from the pixel circuits P of the even-numbered column in the corresponding column group to a 17-bit digital pixel signal DP, based on the reference voltages VR0 through VR16.

Further, a horizontal transfer circuit 6a is disposed adjacent to the upper side in the drawing of the A/D converters 5a. A horizontal transfer circuit 6b is disposed adjacent to the lower side in the drawing of the A/D converters 5b. The horizontal transfer circuit 6a temporarily holds a plurality of digital pixel signals DP supplied thereto from the successive comparison type A/D converters 5a and thereafter sequentially the held digital pixel signals DP to the corresponding signal processing circuit 7 one by one. Further, the horizontal transfer circuit 6b temporarily holds a plurality of digital pixel signals DP supplied thereto from the successive comparison type A/D converters 5b and thereafter sequentially the held digital pixel signals DP to the signal processing circuit 7 one by one.

The signal processing circuit 7 converts each of the 17-bit digital pixel signals DP given from the horizontal transfer circuits 6a and 6b to a 14-bit digital pixel signal DO and outputs it to the outside.

In the eighth embodiment, it is possible to easily cope with an increase in the area of the pixel array 1, miniaturization of the pixel circuit P and an improvement in reading speed in addition to the same advantageous effect as the first embodiment being obtained.

Although the invention made above by the present inventors has been described specifically on the basis of the embodiments, the present invention is not limited to the embodiments referred to above. It is needless to say that various changes can be made thereto within the scope not departing from the gist thereof.

What is claimed is:

1. A solid-state imaging apparatus comprising:
pixel circuits each of which outputs an analog pixel signal corresponding to an incident light quality;
a reference voltage generating circuit which generates first through Nth reference voltages; and
A/D converters of successive comparison type, each of which converts the analog pixel signal to an output digtal signal based on the first through Nth reference voltages;
wherein the A/D converter includes:
a D/A converter which converts a digital reference signal to an analog reference signal;
a comparator which compares the analog pixel signal and the analog reference signal; and
a successive approximation register which generates the digital reference signal based on an output signal of the comparator, and
wherein the D/A converter includes:
a multiplexer which selects (n−1)th through (n+2)th reference voltages of the first through Nth reference voltages; and
a capacitor array which receives the (n−1)th through (n+2)th reference voltages and outputs the analog reference signal.

2. The solid-state imaging apparatus according to claim 1, wherein, in a first mode, the capacitor array outputs n-th reference voltage as the analog reference signal, and
wherein, in the second mode, the capacitor array generates the analog reference signal based on the (n−1)th through (n+2)th reference voltages.

3. The solid-state imaging apparatus according to claim 1, wherein said n is an integer of 1 or more and (N−1) or less.

4. The solid-state imaging apparatus according to claim 1, wherein the capacitor array includes:
an output terminal at which the analog reference signal appears;
a dummy capacitor having one electrode coupled to the output terminal and the other electrode which receives the nth reference voltage;
first through Mth capacitors having one electrodes coupled to the output terminal; and
switching circuits each of which applies any of the (n−1)th through (n+1)th reference voltages to each of the other electrodes of the first through Mth capacitors, and
wherein the capacitance value of the dummy capacitor is the same as the capacitance value of the first capacitor, and the capacitance values of the first through Mth capacitors sequentially increase to be double.

5. The solid-state imaging apparatus according to claim 1, wherein the capacitor array includes:
an output terminal at which the analog reference signal appears;
a split capacitor having one electrode coupled to the output terminal;
a dummy capacitor having one electrode coupled to the other electrode of the split capacitor, and the other electrode which receives the nth reference voltage;
first through mth capacitors having one electrodes coupled to the other electrode of the split capacitor;
(m+1)th through Mth capacitors having one electrodes coupled to the output terminal; and
switching circuits each of which applies any of the (n−1)th through (n+1)th reference voltages to each of the other electrodes of the first through Mth capacitors, and
wherein the split capacitor and the dummy capacitor are approximately equal in capacitance value to each other, the dummy capacitor, the first capacitor and the (m+1)th capacitor are equal in capacitance value to each other, the capacitance values of the first through mth capacitors sequentially increase to be double, and the capacitance values of the (m+1)th through Mth capacitors sequentially increase to be double.

6. The solid-state imaging apparatus according to claim 1, including the pixel circuits disposed in a plurality of rows and a plurality of columns,
wherein each of the successive comparison type A/D converters is provided corresponding to each column and performs the A/D conversion of the analog pixel signal outputted from the corresponding pixel circuit of the row selected out of the rows, and
wherein said solid-state imaging apparatus further includes a signal processing circuit which is provided common to the successive comparison type A/D converters and generates a digital pixel signal, based on an output signal of each of the successive comparison type A/D converters.

7. The solid-state imaging apparatus according to claim 1, including the pixel circuits disposed in a plurality of rows and a plurality of columns,
wherein each of the successive comparison type A/D converters is provided corresponding to each column and performs the A/D conversion of the analog pixel signal outputted from the corresponding pixel circuit of the row selected out of the rows, and
wherein said solid-state imaging apparatus further includes signal processing circuits which are provided corresponding to each column and generate digital pixel signals, based on output signals of the corresponding successive comparison type A/D converters.

8. The solid-state imaging apparatus according to claim 1, wherein the reference voltage generating circuit includes a ladder resistor which divides the voltage between the Nth reference voltage and the first reference voltage to generate (N−1)th through second reference voltages.

9. The solid-state imaging apparatus according to claim 1, wherein the reference voltage generating circuit includes:
a first variable current source which outputs a current of a value corresponding to a control signal, and
a ladder resistor having one terminal which receives the output current of the first variable current source, and the other terminal which receives the first reference voltage and outputs second through Nth reference voltages each having a level corresponding to the output current of the first variable current source.

10. The solid-state imaging apparatus according to claim 9, wherein the reference voltage generating circuit further includes a second variable current source which is coupled between the other terminal of the ladder resistor and a line of a standard voltage and allows a current of a value corresponding to the control signal to flow out.

11. The solid-state imaging apparatus according to claim 1,
wherein the reference voltage generating circuit includes:
a first transistor, a first ladder resistor and a second transistor coupled in series between a line of a power supply voltage and a line of a standard voltage;
a first operational amplifier which controls a gate voltage of the first transistor in such a manner that the voltage of a first node between the first transistor and the first ladder resistor coincides with the voltage of a control signal;

a second operational amplifier which controls a gate voltage of the second transistor in such a manner that the voltage of a second node between the first ladder resistor and the second transistor coincides with the first reference voltage; and a third transistor, a second ladder resistor and a fourth transistor coupled in series between the line of the power supply voltage and the line of the standard voltage, wherein the gates of the first and third transistors are coupled to each other, wherein the gates of the second and fourth transistors are coupled to each other, wherein the resistance value of the second ladder resistor is smaller than the resistance value of the first ladder resistor, and wherein the second ladder resistor outputs the first through Nth reference voltages.

12. A semiconductor device comprising:

a reference voltage generating circuit which generates first through Nth reference voltages; and successive comparison type A/D converters each of which performs an A/D conversion of an analog input signal, based on the first through Nth reference voltages, wherein each of (N−1) subrange regions between the first and Nth reference voltages are divided into a sectional regions, wherein the A/D conversion includes a high-order bit A/D conversion for determining whether the voltage of the analog input signal is a voltage included in a subrange region between the nth and (n+1)th reference voltages of the first through Nth reference voltages, and a low-order bit A/D conversion for determining based on a result of the high-order bit A/D conversion, in which sectional region the voltage of the analog input signal is included within 3×α sectional regions included in three subrange regions between the (n−1)th and (n+2)th reference voltages including the nth and (n+1)th reference voltages, wherein each of the successive comparison type A/D converter includes:

a D/A converter which converts a digital reference signal to an analog reference signal;

a comparator which compares the magnitudes of the analog input signal and the analog reference signal with each other and outputs a signal indicative of a result of comparison; and a successive approximation register which is operated based on the result of comparison by the comparator to generate the digital reference signal in such a manner that the analog reference signal approximates the analog input signal, wherein the D/A converter includes:

a multiplexer which, when the high-order bit A/D conversion is performed, selects any of the first through Nth reference voltages, based on the digital reference signal and which, when the low-order bit A/D conversion is performed, selects the (n−1)th through (n+2)th reference voltages of the first through Nth reference voltages, based on the result of the high-order bit A/D conversion; and a capacitor array which, when the high-order bit A/D conversion is performed, transfers each of the reference voltages selected by the multiplexer to the comparator as the analog reference signal and which, when the low-order bit A/D conversion is performed, receives the (n−1)th through (n+2)th reference voltages selected by the multiplexer and generates the analog reference signal for specifying any of the 3×α sectional regions between the (n−1)th and (n+2)th reference voltages, based on the digital reference signal.

13. The semiconductor device according to claim 12, wherein the capacitor array includes:

an output terminal at which the analog reference signal appears;

a dummy capacitor having one electrode coupled to the output terminal and the other electrode which receives the nth reference voltage;

first through Mth capacitors having one electrodes coupled to the output terminal;

first through Mth switching circuits which are provided corresponding to the first through Mth capacitors and each of which switches coupling between each of the other electrodes of the first through Mth capacitors and any of the (n−1)th through (n+2)th reference voltages; and wherein the first through Mth switching circuits includes a first class switching circuit which selects any one of the nth and (n+1)th reference voltages and applies the same to the other electrode of the corresponding capacitor, and a second class switching circuit which selects any one of the (n−1)th through (n+2)th reference voltages and applies the same to the other electrode of the corresponding capacitor.

* * * * *